(12) United States Patent
Kim et al.

(10) Patent No.: US 7,700,454 B2
(45) Date of Patent: Apr. 20, 2010

(54) METHODS OF FORMING INTEGRATED CIRCUIT ELECTRODES AND CAPACITORS BY WRINKLING A LAYER THAT INCLUDES A HIGH PERCENTAGE OF IMPURITIES

(75) Inventors: Wan-don Kim, Yongin-si (KR); Jae-hyun Joo, Yongin-si (KR); Seok-jun Won, Seoul (KR); Jung-hee Chung, Suwon-si (KR); Jin-yong Kim, Seoul (KR); Suk-jin Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 807 days.

(21) Appl. No.: 11/462,178

(22) Filed: Aug. 3, 2006

(65) Prior Publication Data

US 2006/0263977 A1    Nov. 23, 2006

Related U.S. Application Data

(63) Continuation-in-part of application No. 10/201,070, filed on Jul. 23, 2002, now abandoned.

(60) Provisional application No. 60/307,454, filed on Jul. 24, 2001.

(30) Foreign Application Priority Data

Jul. 18, 2006  (KR) .................. 10-2006-0067100

(51) Int. Cl.
*H01L 21/20* (2006.01)
(52) U.S. Cl. .................. 438/398; 438/255; 438/239; 438/665; 438/686; 257/309
(58) Field of Classification Search ............. 438/665, 438/686, 660, 239, 255, 260, 398, 680, 681; 257/309
See application file for complete search history.

(56) References Cited

U.S. PATENT DOCUMENTS 5,821,152 A    10/1998    Han et al.

(Continued)

FOREIGN PATENT DOCUMENTS

JP         10-270662          10/1998

(Continued)

OTHER PUBLICATIONS

Fukuzumi et al., *Liner-Support Cylinder (LSC) Technology to Realize Ru Ta$_2$O$_5$/Ru Capacitor for Future DRAMs*, IEDM, 2000, pp. 793-796.

(Continued)

*Primary Examiner*—Matthew C Landau
*Assistant Examiner*—Candice Y Chan
(74) *Attorney, Agent, or Firm*—Myers Bigel Sibley & Sajovec, P.A.

(57) ABSTRACT

A method of fabricating a uniformly wrinkled capacitor lower electrode without the need to perform a high-temperature heat treatment and a method of fabricating a capacitor including the uniformly wrinkled capacitor lower electrode are provided. A first conductive layer is formed. Then, a second conductive layer including about 20% to about 50% of impurities is formed on the first conductive layer. Next, at least some of the impurities are exhausted from the second conductive layer by heat treating the second conductive layer. A surface of the second conductive layer is wrinkled due to the exhaustion of the impurities from the second conductive layer. A dielectric layer and an upper capacitor electrode may then be formed.

35 Claims, 27 Drawing Sheets

U.S. PATENT DOCUMENTS

| | | |
|---|---|---|
| 5,885,867 A | 3/1999 | Shin et al. |
| 5,960,281 A | 9/1999 | Nam et al. |
| 6,004,858 A | 12/1999 | Shim et al. |
| 6,077,573 A | 6/2000 | Kim et al. |
| 6,087,226 A | 7/2000 | Kim et al. |
| 6,117,692 A | 9/2000 | Kim et al. |
| 6,238,973 B1 | 5/2001 | Pyun |
| 6,245,632 B1 | 6/2001 | Kim et al. |
| 6,333,227 B1 | 12/2001 | Kim et al. |
| 6,750,092 B2 | 6/2004 | Won et al. |
| 6,833,576 B2 | 12/2004 | Agarwal et al. |
| 6,897,160 B2 | 5/2005 | Derderian et al. |

FOREIGN PATENT DOCUMENTS

| | | |
|---|---|---|
| JP | 11-121711 | 4/1999 |
| JP | 11-150245 | 6/1999 |
| JP | 2001-36042 A | 2/2001 |
| KR | 2002-0055118 A | 7/2002 |
| WO | WO 00/13216 | 3/2000 |

OTHER PUBLICATIONS

Hiratani et al., *Hydrogen Reduction Properties of $RuO_2$ Electrodes*, Jpn. J. Appl. Phys., vol. 38, Part 2, No. 11A, Nov. 1, 1999, pp. 1275-1277.

Lauth et al., *The Adsorption of Hydrogen on a Ruthenium $(10\bar{1}0)$ Surface*, J. Chem. Phys., vol. 91, No. 6, Sep. 15, 1989, pp. 3729-3743.

Notice to Submit Response, KR Application No. 2002-0043693, Mar. 17, 2005.

Notice to Submit Response, KR Application No. 2002-0043693, Aug. 26, 2004.

Tsuzumitani et al., *Ru-$Ta_2O_5$ MIM Capacitor Toward 0.1 µm DRAM Cell*, Extended Abstracts of the 1999 International Conference on Solid State Devices and Materials, Tokyo, 1999, pp. 492-493.

Won et al., *Conformal CVD-Ruthenium Process for MIM Capacitor in Giga-Bit DRAMs*, IEDM, 2000, pp. 789-792.

(WITHOUT HEAT TREATMENT)

(HEAT TREATMENT)

METHODS OF FORMING INTEGRATED CIRCUIT ELECTRODES AND CAPACITORS BY WRINKLING A LAYER THAT INCLUDES A HIGH PERCENTAGE OF IMPURITIES

CROSS-REFERENCE TO RELATED APPLICATIONS

This application is a continuation-in-part of application Ser. No. 10/201,070, filed Jul. 23, 2002, now abandoned entitled Methods of Forming Integrated Circuit Electrodes and Capacitors by Wrinkling a Layer That Includes a Noble Metal Oxide, and Integrated Circuit Electrodes and Capacitors Fabricated Thereby, which itself claims the benefit of provisional Application Ser. No. 60/307,454, filed on Jul. 24, 2001, entitled Semiconductor Device with Capacitor Having a Lower Electrode with Increased Surface Area and Method for Manufacturing the Same, the disclosures of both of which are hereby incorporated herein by reference in their entirety as if set forth fully herein. This application also claims the benefit under 35 USC §119 of Korean Patent Application No. 10-2006-0067100, filed on Jul. 18, 2006, the disclosure of which is hereby incorporated herein by reference in its entirety as if set forth fully herein

FIELD OF THE INVENTION

This invention relates to integrated circuit devices and fabrication methods, and more particularly to integrated circuit electrodes and capacitors and fabrication methods therefor.

BACKGROUND OF THE INVENTION

Integrated circuit devices are widely used in consumer and commercial applications. Many integrated circuit devices include integrated circuit capacitors therein. For example, many memory devices, such as Dynamic Random Access Memory (DRAM) devices, include integrated circuit capacitors. As is well known to those having skill in the art, an integrated circuit capacitor generally includes a first (lower) electrode, a second (upper) electrode and a dielectric therebetween.

As the integration density of integrated circuit devices continues to increase, it may become desirable to increase the capacitance per unit area of an integrated circuit capacitor. As is well known, the capacitance per unit area may be increased by increasing the effective area of the capacitor, by decreasing the thickness of the dielectric, and/or by increasing the dielectric constant of the dielectric material.

Three-dimensional electrode structures, such as cylindrical, finned and/or trench electrode structures have been developed, to thereby increase the effective area of the capacitor per unit area in the integrated circuit substrate. It is also known to form hemispherical grain silicon electrodes, to increase the surface area of an integrated circuit electrode per unit area of the integrated circuit substrate. See, for example, U.S. Pat. Nos. 6,333,227; 6,245,632; 6,238,973; 6,117,692; 6,087,226; 6,077,573; 6,004,858; 5,960,281; 5,885,867 and 5,821,152, all of which are assigned to the assignee of the present invention, the disclosures of all of which are hereby incorporated herein by reference in their entirety as if set forth fully herein.

It may be desirable to use metal as an integrated circuit electrode, such as a lower electrode of an integrated circuit capacitor, rather than silicon or polysilicon. For example, noble metals, such as platinum (Pt), ruthenium (Ru) and/or iridium (Ir) and/or their oxides may be used as an integrated circuit electrode, such as a lower electrode. In particular, ruthenium-based electrodes, including ruthenium oxide-based electrodes, may be etched by oxygen-containing plasma to form a conductive metal oxide layer. Thus, ruthenium-based electrodes may be particularly desirable.

It is known to increase the surface area of noble metal-containing electrodes using high temperature agglomeration, sputtering and/or oxygen plasma treatments. See, for example, Japanese Publication No. 10-270662, published Oct. 9, 1998 to Takeharu entitled Semiconductor Storage Device Having Capacitor and Its Manufacture; Japanese Publication No. 11-121711, published Apr. 30, 1999 to Teruo et al. entitled Manufacture of Capacitor, Manufacture of Semiconductor Device Capacitor and Semiconductor Device Capacitor; and published PCT Publication No. WO 00/13216, published Mar. 9, 2000 to Marsh et al. entitled Capacitors Comprising Roughened Platinum Layers, Methods of Forming Roughened Layers of Platinum and Methods of Forming Capacitors.

SUMMARY OF THE INVENTION

Electrodes, such as integrated circuit capacitor lower electrodes, may be fabricated according to some embodiments of the present invention, by forming a first conductive layer on an integrated circuit substrate, and forming a second conductive layer to include about 20% to about 50% of impurities, on the first conductive layer. At least some of the impurities are exhausted from the second conductive layer by heat treating the second conductive layer, to wrinkle a surface of the second conductive layer due to the exhaustion of at least some of the impurities from the second conductive layer. In some embodiments, the impurities contained in the second conductive layer comprise carbon.

In some embodiments, the second conductive layer is formed by chemical vapor depositing the second conductive layer at about 100° C. to about 300° C. In some embodiments, the second conductive layer is formed by supplying only a metal source. In other embodiments, the second conductive layer may be formed by atomic layer depositing the second conductive layer. In still other embodiments, the second conductive layer may be formed by supplying a metal source, an oxygen source and a tetrahydrofuran solvent. In yet other embodiments, the first conductive layer has less than about 10% impurity content and, in some embodiments, between about 0.01% and about 10% impurity content.

In some embodiments, the heat treating may be conducted under a reducing atmosphere including hydrogen and/or nitrogen gas. A vacuum atmosphere of about 0.01 mTorr to about 10 mTorr, and temperatures between about 300° C. and about 500° C. may be used. In still other embodiments, exhausting at least some of the impurities may be performed such that less than about 10% of the impurities remain in the second conductive layer and/or at least about 50% of the original impurities are exhausted.

In yet other embodiments, a capacitor may be fabricated on the electrode by forming a dielectric film on the wrinkled surface of the electrode and forming an upper electrode on the dielectric film. In still other embodiments, an integrated circuit electrode, such as an integrated circuit lower capacitor electrode, may be fabricated by forming a conductive layer to include about 20% to about 50% of impurities, such as carbon, and exhausting at least some of the impurities from the conductive layer by heat treating the conductive layer to wrinkle a surface of the conductive layer due to the exhaustion of at least some of the impurities from the conductive layer. Sufficient carbon may be exhausted, in some embodiments, such that about 10% carbon remains in the conductive layer and/or at least about 50% of the original carbon may be exhausted. The conductive layer may be formed using any of the techniques that were described above for forming the second conductive layer.

DETAILED DESCRIPTION

Figure 1A:
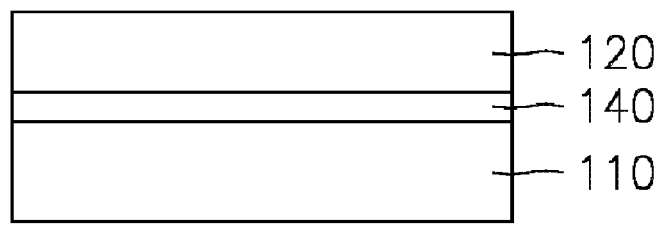
FIGS. 1A and 1B are cross-sectional views of integrated circuit electrodes according to some embodiments of the present invention during intermediate fabrication steps according to some embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As was described above, it may be desirable to fabricate an integrated circuit electrode, such as a first (lower) electrode of an integrated circuit capacitor, from a noble metal, such as ruthenium, platinum and/or iridium, and/or an oxide thereof such as RuOx (i.e., $RuO_2$), PtOx (i.e., $PtO_2$) and/or IrOx (i.e., $IrO_2$), because these materials may not react with the dielectric layer of the capacitor and also may have a high work function. Dielectric layers for integrated circuit capacitors may include tantalum oxide and/or high dielectric constant material(s), such as $SrTiO_3$ (Ba, Sr)$TiO_3$ and/or (Pb, La)(Zr, Ti)$O_3$. Moreover, because ruthenium may be easy to pattern, ruthenium has been widely used in integrated circuit devices, such as DRAMs or ferroelectric random access memory devices (FRAM). Although ruthenium oxide films may exhibit varying electrical conductivities based on their oxygen content, they may be used as an electrode material. Moreover, since ruthenium oxide may have almost the same work function as ruthenium, it may have similar characteristics. For these and/or other reasons a lower electrode comprising ruthenium and a capacitor structure comprising, for example, Ru—$Ta_2O_5$—Ru, may be desirable for integrated circuit devices and fabrication processes.

Many techniques are known for forming a ruthenium oxide film. For example, ruthenium oxide may be formed by sputtering using a ruthenium metal target. Alternatively, a ruthenium organic source may be used to deposit ruthenium in an oxygen-containing ambient. Alternatively, a ruthenium layer may be formed on an integrated circuit substrate and oxidized, for example by heat treating in an oxygen-containing atmosphere, and/or exposing the ruthenium layer to an oxygen plasma. It is also known that when forming a ruthenium oxide film by reacting a ruthenium film in oxygen, the volume (thickness) of the ruthenium oxide film may be increased by the oxygen. For example, the ruthenium oxide film may have a volume that is about twice as large as the ruthenium film.

Figure 1B:
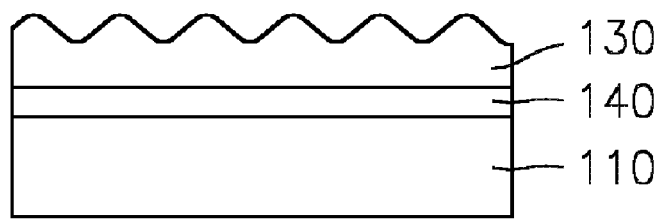

FIGS. 1A and 1B are cross-sectional views of integrated circuit electrodes according to some embodiments of the present invention during intermediate fabrication steps according to some embodiments of the invention. In particular, referring to FIG. 1A, a layer 120 comprising noble metal oxide such as ruthenium oxide is formed on an integrated circuit substrate 110. Then, in FIG. 1B, the layer comprising noble metal oxide is wrinkled by removing at least some oxygen from the layer comprising noble metal oxide, to thereby produce a wrinkled layer 130.

As shown in FIG. 1B, in some embodiments of the invention, wrinkling may be performed by exposing the layer comprising noble metal oxide to a reducing ambient, to thereby produce the wrinkled layer 130. The reduction reaction can be $RuO_2+H_2 \leftrightarrows Ru+H_2O$. As also shown in FIGS. 1A and 1B, in some embodiments of the invention, wrinkling may be performed by deoxidizing the layer comprising noble metal oxide, to thereby produce the wrinkled layer 130. FIGS. 1A and 1B also provide an example of other embodiments of the invention, wherein wrinkling of a layer 120 comprising metal and another constituent is performed by removing at least some of the other constituent from the layer 120 comprising metal and another constituent, to thereby produce a wrinkled layer 130. Finally, FIGS. 1A and 1B also illustrate embodiments of the invention wherein a layer 120 comprising noble metal is wrinkled by decreasing the volume and/or thickness of the layer comprising noble metal on the integrated circuit substrate. Other embodiments will be described below.

Figure 1C:
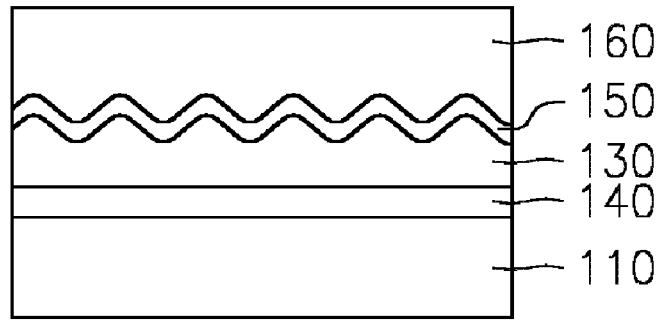
FIG. 1C is a cross-sectional view of integrated circuit capacitors according to some embodiments of the present invention.

The wrinkled layer 130 can provide an integrated circuit electrode according to some embodiments of the invention. This integrated circuit electrode may be used in many integrated circuit applications including as a first (lower or bottom) electrode of an integrated circuit capacitor FIG. 1C is a cross-sectional view of an integrated circuit capacitor that may be fabricated using a first electrode according to embodiments of the present invention. In particular, one or more dielectric layers 150 is provided on the wrinkled layer 130 opposite the substrate 110 and a second (upper or outer) electrode 160 is provided on the dielectric layer 150 opposite the wrinkled layer 130. Examples of dielectric layers 150 that can be used will be described below. The fabrication of dielectric layers 150 and upper electrodes 160 are well known to those having skill in the art and need not be described in further detail herein.

Referring again to FIGS. 1A and 1B, the substrate 110 may be a conventional integrated circuit substrate, such as a silicon semiconductor substrate. However, other conventional semiconductor materials, such as silicon carbide, gallium arsenide and/or gallium nitride, and/or non-semiconductor materials, such as glass, may be used. Moreover, the substrate may comprise a plurality of layers, such as one or more epitaxial layers on a base substrate, or one or more layers that are separated from a base substrate by an insulating layer, such as may be used in conventional semiconductor-on-insulator (SOI) technology. Many other substrate materials may be used.

Layer 120 may comprise a noble metal oxide, such as ruthenium oxide. As shown in FIG. 1B, by heat treating in a reducing atmosphere, oxygen contained in the ruthenium oxide layer 120 may be fully or partially exhausted, for example as oxygen or water vapor, so that the volume of the ruthenium oxide may be decreased gradually, thereby obtaining a wrinkled layer 130 that has an irregular surface. It will be understood that all of the oxygen may be removed, so that the wrinkled layer 130 that remains may consist essentially of noble metal. Alternatively, only some of the oxygen may be removed, so that the wrinkled layer 130 may also comprise noble metal and noble metal oxide.

Still referring to FIGS. 1A and 1B, one or more barrier layers 140 may be provided between the substrate 110 and the layer 120. This barrier layer may comprise the noble metal such as ruthenium, titanium nitride, tantalum oxide, silicon dioxide, silicon nitride and/or other conventional materials. Other embodiments will be described below. It will be understood that when the layer 120 is wrinkled, its volume decreases and its surface area increases to form the wrinkled layer 130. The barrier layer 140 may be exposed due to changes in the shape of the layer 120. In a capacitor application, this may allow the barrier layer to directly contact a dielectric layer 150 that is formed subsequently on the wrinkled layer 130. This may undesirably degrade the integrated circuit capacitor. Accordingly, in some embodiments of the invention, the layer 120 comprising noble metal oxide is wrinkled without uncovering an underlying region of the integrated circuit substrate directly beneath the wrinkled layer 130.

In other embodiments, the barrier layer 140 comprises a stable layer, the shape or volume of which may not change during the wrinkling step. This barrier layer may include a ruthenium layer. Thus, for example, a ruthenium layer may be formed and only partially oxidized, so that a ruthenium barrier layer lies beneath the ruthenium oxide layer 120.

Figure 2A:
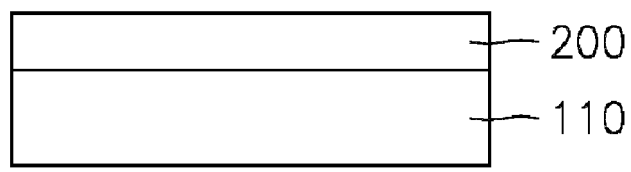
FIGS. 2A-2D are cross-sectional views of integrated circuit electrodes according to other embodiments of the invention during intermediate fabrication steps according to other embodiments of the invention.
Figure 2B:
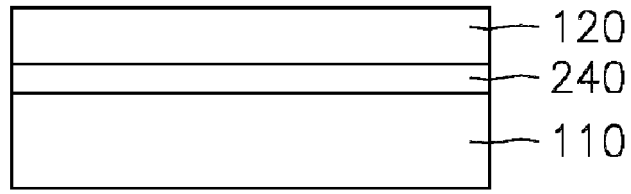

FIGS. 2A-2D are cross-sectional views of integrated circuit electrodes according to other embodiments of the invention during intermediate fabrication steps according to other embodiments of the invention. As shown in FIG. 2A, a ruthenium barrier layer 240 is formed on an integrated circuit substrate 110. Then, as shown in FIG. 2B, a layer 120 comprising a noble metal oxide such as ruthenium oxide, is formed on the barrier layer 240 comprising ruthenium. Finally, a dielectric layer and second electrode may be provided as was shown in FIG. 1C.

Figure 2C:
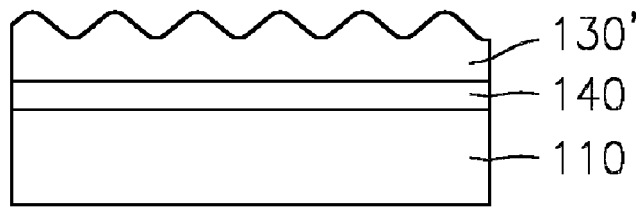
Figure 2D:
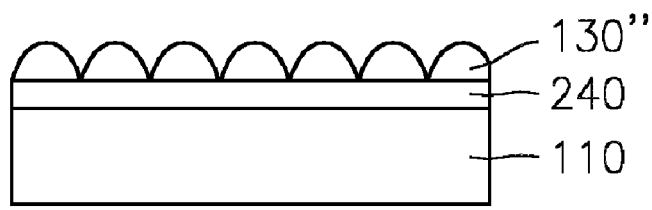

As shown in FIG. 2C, a partial reduction reaction can cause between about 30% to about 50% of the thickness of the ruthenium oxide layer 120 to be wrinkled to produce a wrinkled layer 130'. Moreover, as shown in FIG. 2D, up to 100% of the thickness of the ruthenium oxide layer 120 can be wrinkled in a full reduction to produce a wrinkled layer 130". The partial wrinkling of FIG. 2C may occur by performing a partial reduction of the ruthenium oxide, so that only some of the oxygen is removed. The full wrinkling of FIG. 2D may be obtained by performing a full reduction of the ruthenium oxide, so that fully wrinkled layer 130" consists essentially of ruthenium.

In either case, as shown in FIGS. 2C and 2D, the reduction reaction can cause the volume of the layer comprising ruthenium oxide 120 to be decreased, and the surface area to be increased, so that a wrinkled layer 130', 130" is formed. Moreover, as also shown in FIGS. 2A-2D, the underlying barrier layer 240 comprising Ru need not change in shape or volume during the reduction reaction, to thereby provide a barrier between the integrated circuit substrate 110 and the wrinkled layer 130', 130". The reduction in volume of an electrode comprising $RuO_2$ under a reducing atmosphere is described in a publication entitled "Hydrogen Reduction Properties of $RuO_2$ Electrodes" by Haritoni et al., *Japanese Journal of Applied Physics*, 38 L1275-L1277, Part II, No. 11A (1 Nov. 1999), the disclosure of which is hereby incorporated by reference in its entirety as if set forth fully herein. As described therein, the thickness of a ruthenium oxide layer may be reduced between about 1.5 and about 3 times when the ruthenium oxide layer is reduced under various conditions. For example, a ruthenium oxide layer having an initial thickness of about 31.5 Ångstroms may be reduced to a ruthenium layer having thickness of about 13.6 Ångstroms. Accordingly, a reduction of about 2.3 times in thickness may be obtained.

Figure 3A:
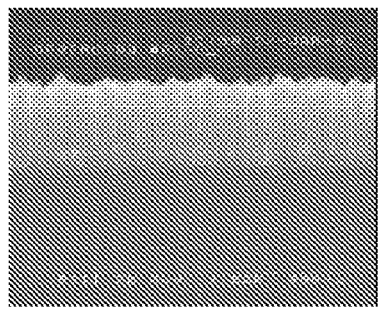
FIGS. 3A, 4A, 5A and 6A are cross-sectional images of ruthenium oxide layers that were annealed in various ambient atmospheres according to some embodiments of the present invention.
Figure 3B:
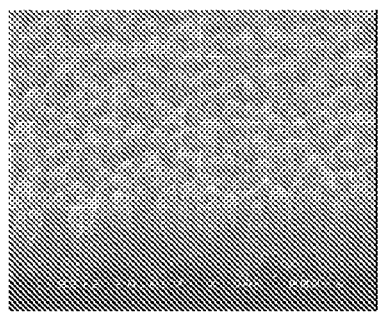
FIGS. 3B, 4B, 5B and 6B are top perspective images of ruthenium oxide layers that were annealed in various ambient atmospheres according to some embodiments of the present invention.
Figure 4A:
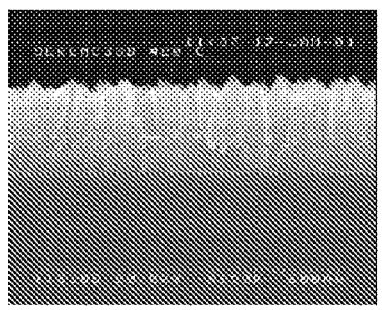
Figure 4B:
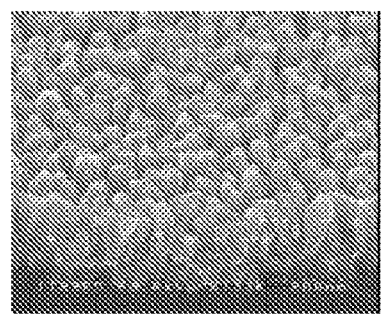
Figure 5A:
Figure 5B:
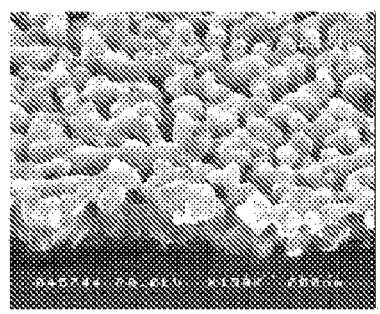
Figure 6A:
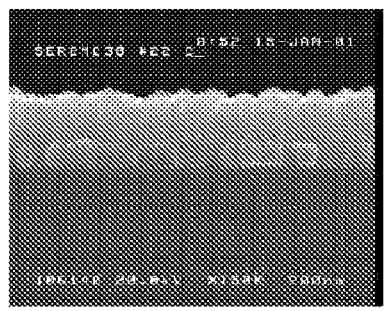
Figure 6B:
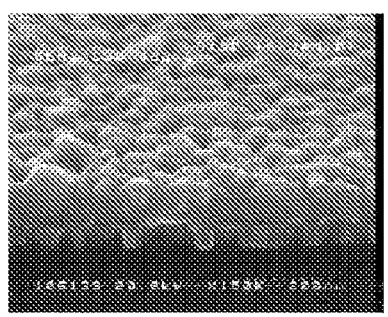

FIGS. 3A-6B are scanning electron microscope (SEM) images illustrating cross-sectional views (FIGS. 3A, 4A, 5A and 6A) and top perspective views (FIGS. 3B, 4B, 5B and 6B) of ruthenium oxide layers that were annealed in various ambient atmospheres according to some embodiments of the invention. In all of these FIGS. 3A-6B, a ruthenium layer was deposited on a silicon semiconductor substrate including tantalum oxide and silicon dioxide barrier layers thereon, using chemical vapor deposition. A ruthenium oxide layer then was deposited on the ruthenium layer using a separate chemical vapor deposition. FIGS. 3A and 3B illustrate annealing in a 100% $N_2$ ambient at 450° C. for thirty minutes. FIGS. 4A-4B illustrate annealing in vacuum (low pressure) at 450° C. for thirty minutes. FIGS. 5A-5B illustrate annealing in a 10% hydrogen ambient at 450° C. for thirty minutes. Finally, FIGS. 6A-6B illustrate annealing in 100% nitrogen at 700° C. for thirty minutes.

As shown in FIGS. 5A-5B, by treating in a hydrogen-containing ambient such as 10% hydrogen and 90% inert gas (e.g., nitrogen), a greater amount of wrinkling may be obtained compared to treating in a non-reducing ambient (FIGS. 3A-3B and 6A-6B) or in vacuum (FIGS. 4A-4B). Thus, in FIGS. 5A-5B, at least some of the oxygen contained in the ruthenium oxide layer appeared to be exhausted more effectively in the reducing ambient compared to being heat-treated in an inert atmosphere between 300° C. and 700° C. or under low pressure (for example, less than about 100 mTorr). Since the spaces between the crystalline grains in the ruthenium oxide layer of FIG. 5A are empty and columnar, it is reasonable to conclude that oxygen existing between the crystalline grains of the ruthenium oxide layer were exhausted during the heat treatment. As shown in FIGS. 3A-3B, 4A-4B and 6A-6B, the surface of the ruthenium oxide layer was either unchanged or little changed by nitrogen annealing or low pressure annealing.

In some embodiments of the present invention, the reducing ambient is a hydrogen-containing ambient. In other embodiments, the hydrogen-containing ambient consists of between about 1% and about 100% hydrogen and between about 0% to about 99% inert gas. The inert gases may comprise argon, nitrogen, helium and/or other inert gases. The inert gases can enhance the stability of the reaction that is performed in the hydrogen-containing reducing atmosphere. Other techniques for treating a lower electrode composed of ruthenium oxide in nitrogen diluted hydrogen to produce a ruthenium layer are described in Japanese Patent Application No. 11-150245 published Jun. 2, 1999 to Takeshi entitled Manufacture of Semiconductor Device.

Figure 7A:
FIGS. 7A, 8A, 9A and 10A are side cross-sectional images of ruthenium oxide layers that are formed on a ruthenium layer and are heat treated according to some embodiments of the present invention.
Figure 7B:
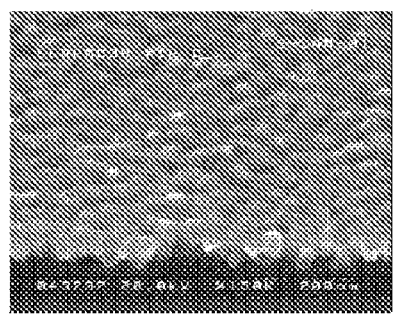
FIGS. 7B, 8B, 9B and 10B are top perspective images of ruthenium oxide layers that are formed on a ruthenium layer and are heat treated according to some embodiments of the present invention.
Figure 8A:
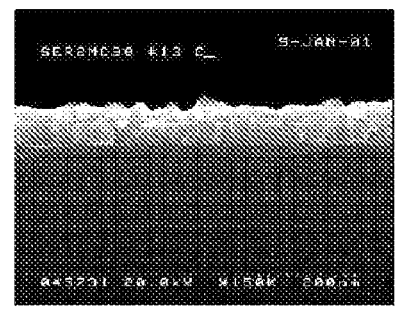
Figure 8B:
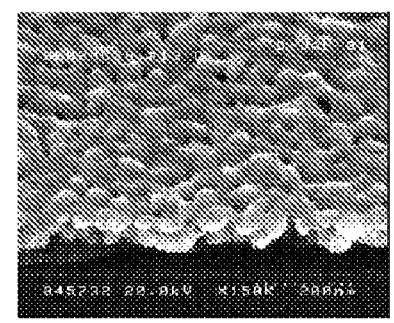
Figure 9A:
Figure 9B:
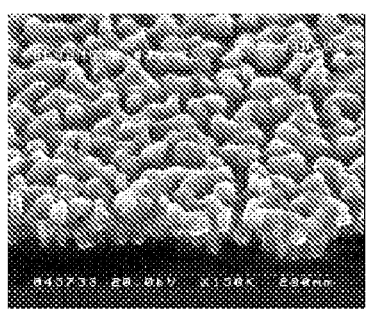
Figure 10A:
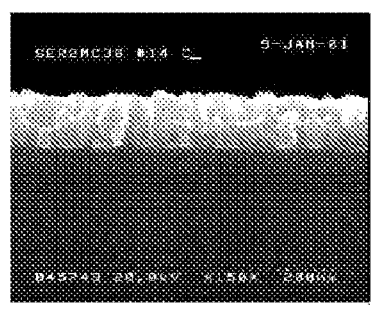
Figure 10B:
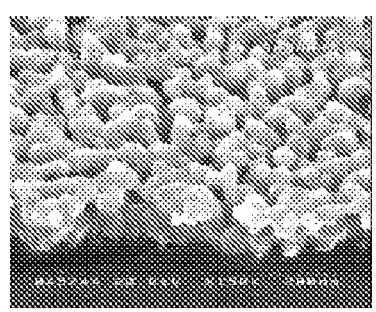

FIGS. 7A-10B are SEM images of ruthenium oxide layers of various thicknesses that are formed on a ruthenium layer and are heat-treated at a temperature of 450° C. at atmospheric pressure in an ambient of 10% hydrogen and 90% nitrogen for thirty minutes. FIGS. 7A, 8A, 9A and 10A are side cross-sectional views, and FIGS. 7B, 8B, 9B and 10B are top perspective views. As was the case in FIGS. 3A-6B, a ruthenium layer was deposited by chemical vapor deposition on a barrier layer of tantalum oxide and silicon dioxide that are on a silicon substrate, and a ruthenium oxide layer was deposited on the ruthenium layer by chemical vapor deposition. As shown in FIGS. 7A-10B, the underlying ruthenium layer is basically unchanged by the heat treatment in the reducing atmosphere. FIGS. 7A/7B, 8A/8B, 9A/9B and 10A/10B correspond to ruthenium oxide layers of 50 Å, 100 Å, 200 Å and 300 Å in thickness, respectively. As shown, as the thickness of the ruthenium oxide layer increases, the surface of the ruthenium oxide layer may become increasingly wrinkled. Stated differently, the thicker the ruthenium oxide layer, the more wrinkled the surface may become. It will be understood that wrinkling also can be a function of the degree of reduction (e.g., annealing time, temperature, hydrogen concentration, etc.).

Thus, in FIGS. 7A-7B and 8A-8B in these experiments, for thicknesses of 50 Å and 100 Å, significant wrinkling may not occur. For a thickness of 200 Å (FIGS. 9A-9B), some wrinkling is evident. Moreover, in these experiments, for thicknesses of 300 Å or greater (FIGS. 10A-10B), the surface shape of the ruthenium oxide layer is almost the same as the surface shape of a hemispherical grain silicon film. Thus, it is possible to increase the capacitance considerably.

It has also been found, according to some embodiments of the invention, that it may be desirable for the thickness of the ruthenium oxide layer to be greater than that of the dielectric layer that is deposited thereon. For example, when the thickness of a dielectric layer comprising $Ta_2O_5$, $Al_2O_3$, $TiO_2$, BST and/or PZT is between about 20 Å and about 300 Å, the ruthenium oxide layer is between about 50 Å to about 400 Å in thickness in some embodiments of the invention.

In other embodiments, high dielectric materials, such as $SrTiO_3$, $(Ba, Sr)TiOx$ and/or $(Pt, La)(Zr, Ti)O_3$, may be used. However, even if a conventional tantalum oxide ($Ta_2O_5$) dielectric layer is used, which has a relatively low dielectric constant, it is possible to obtain an equivalent oxide thickness of about 6 Å. As understood by those having skill in the art, equivalent oxide thickness is the equivalent thickness converted into silicon dioxide under the same capacitance.

In order to investigate electrical characteristics of integrated circuit capacitors that are fabricated according to some embodiments of the present invention, integrated circuit capacitors according to some embodiments of the invention were manufactured as follows: A silicon dioxide layer was deposited on a silicon semiconductor wafer and a tantalum oxide layer was deposited on the silicon dioxide layer. A wide range of conventional thicknesses may be used. A ruthenium layer having a thickness of about 200 Å was formed by chemical vapor deposition on the tantalum oxide layer. A ruthenium oxide layer having a thickness of between about 100 Å and about 300 Å was deposited by chemical vapor deposition on the ruthenium layer. The ruthenium oxide layers were deposited to have different thicknesses, so that each of the wrinkled layers can exhibit different surface wrinkling. The ruthenium oxide layer was heat treated in a reducing atmosphere of 10% hydrogen at 450° C. for thirty minutes, to wrinkle the ruthenium oxide layer. A tantalum oxide dielectric layer of thickness of between about 110 Å and about 150 Å was deposited on the wrinkled layer. The tantalum oxide layer was then heat treated in nitrogen at 700° C. for thirty minutes, to crystallize the tantalum oxide layer. Finally, a ruthenium upper electrode was chemical vapor deposited on the tantalum oxide dielectric layer to a thickness of about 500 Å.

Figure 11A:
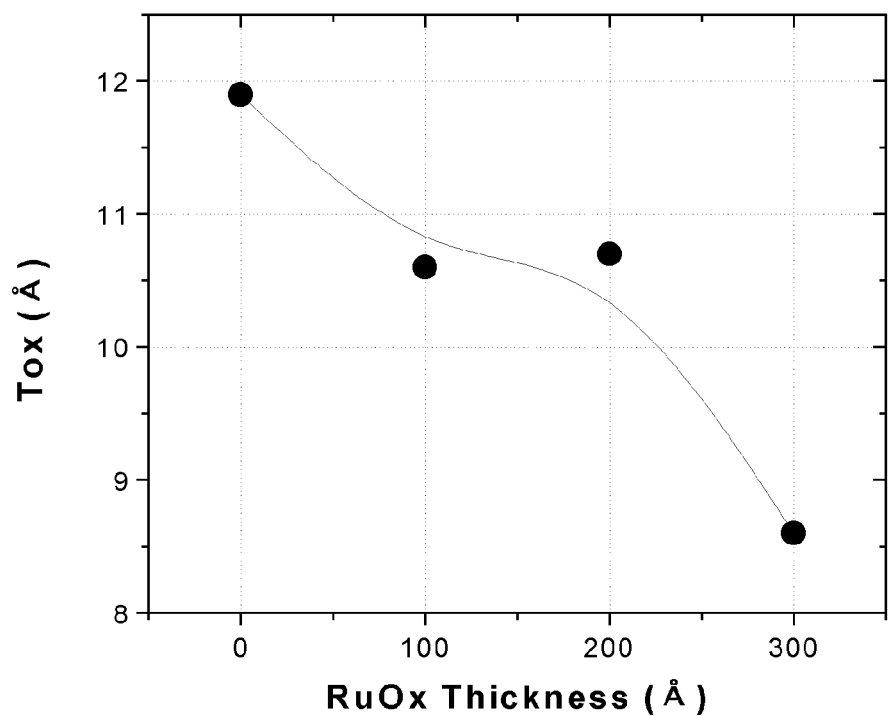
FIGS. 11A-11D graphically illustrate electrical characteristics of wrinkled layers according to some embodiments of the present invention.
Figure 11B:
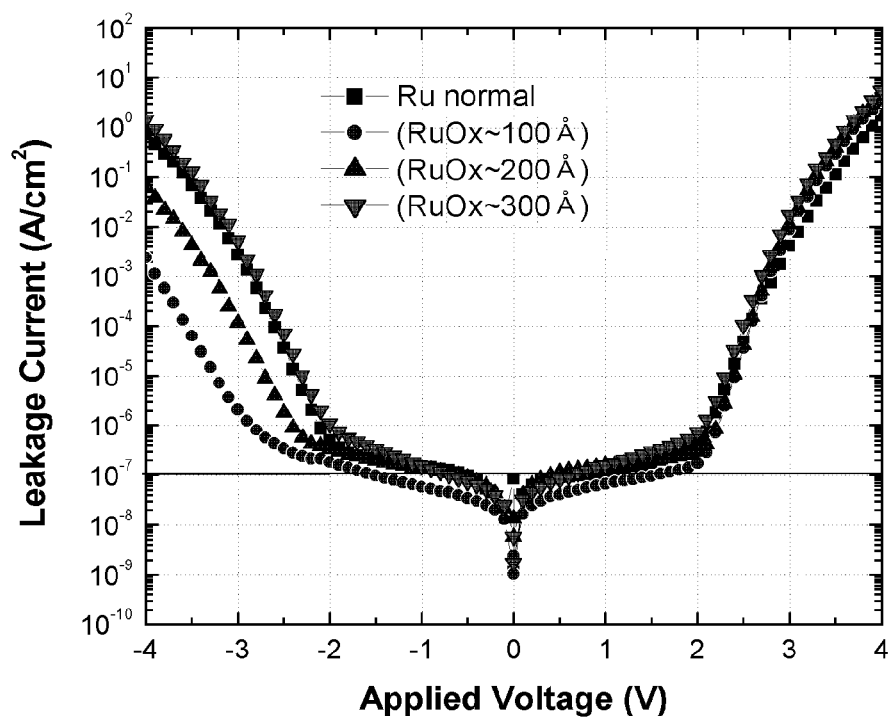

FIG. 11A graphically illustrates the equivalent silicon dioxide thickness of the wrinkled layer as a function of the original thickness of the ruthenium oxide layer of 0 Å, 100 Å, 200 Å and 300 Å. FIG. 11B graphically illustrates leakage current as a function of the thickness of the wrinkled layer that is formed from an original ruthenium oxide layer of 0 Å, 100 Å, 200 Å and 300 Å in thickness.

Referring to FIGS. 11A and 11B, as the thickness of the ruthenium oxide layer increases, the surface wrinkling of the ruthenium oxide layer became more severe and, thus, the effective thickness of the ruthenium oxide layer is decreased. Equivalent silicon dioxide thickness as low as about 6 Å or lower may be obtained. It will be understood that the effective thickness $T_{ox}=(3.9\in_0 A)/C$ where $\in_0$ is the dielectric constant of vacuum and is equal to $8.85\times10^{-12}$ F/m, A is the area of the capacitor and C is the capacitance of the capacitor. In addition, as shown in FIG. 11B, as the degree of wrinkling of the surface of the structure increased, the leakage current increased. However, compared to a conventional ruthenium capacitor in which a wrinkled layer is not formed (Ru normal in FIG. 11B), wrinkled capacitors according to embodiments of the invention can have a lower leakage current.

Stated differently, FIG. 11A illustrates that the effective thickness is decreased as a function of the increasing ruthenium oxide thickness due to the increased surface wrinkling. Moreover, FIG. 11B illustrates that the leakage currents gradually increase as a function of increasing ruthenium oxide thickness. This increase in leakage current may be explained by the effects of hydrogen annealing on the ruthenium metal layer. In any event, the leakage current of the wrinkled layer was lower than that of a conventional ruthenium layer.

Figure 11C:
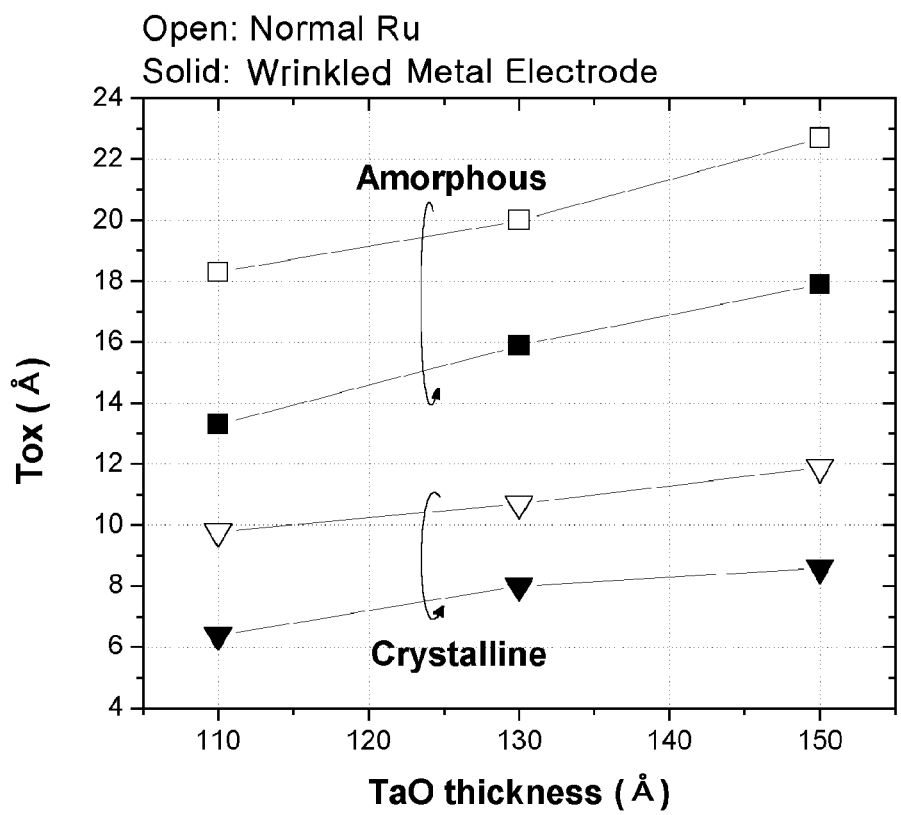
Figure 11D:
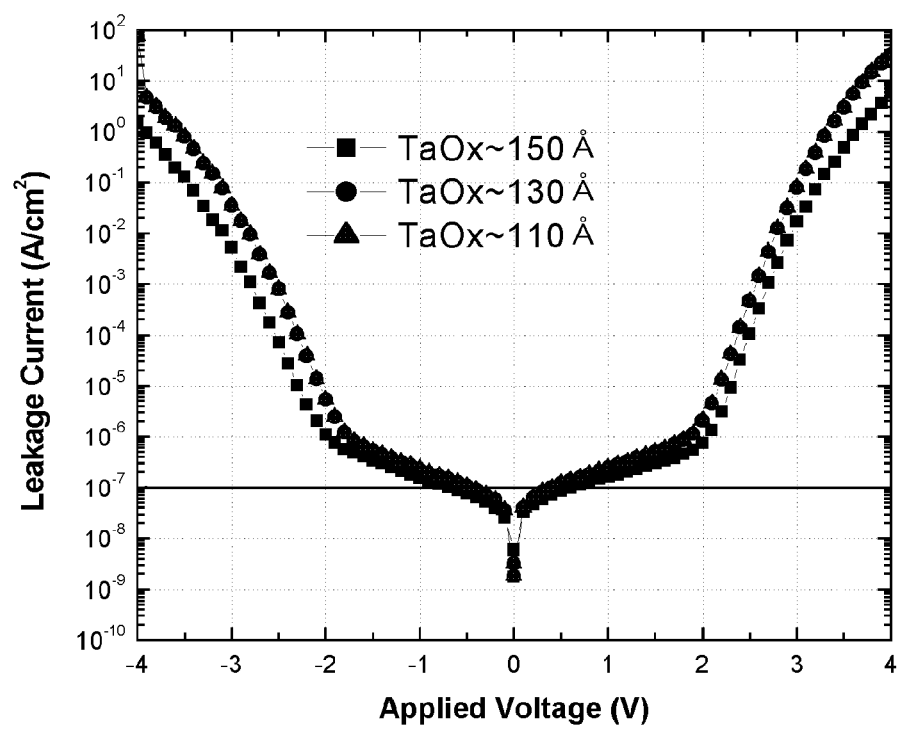

FIGS. 11C and 11D graphically illustrate electrical characteristics of these capacitors, each of which has a different tantalum oxide dielectric layer thickness, wherein the ruthenium oxide layer has a fixed thickness of 300 Å. In particular, FIG. 11C graphically illustrates equivalent oxide thickness versus tantalum oxide thickness for conventional ruthenium electrodes (open squares and triangles) and wrinkled ruthenium oxide electrodes (solid squares and triangles) where the squares indicate amorphous tantalum oxide and the triangles indicate crystalline tantalum oxide. As shown in FIG. 11C, when the tantalum oxide dielectric layer was deposited on the wrinkled electrodes, the surface had almost the same surface wrinkling and, as the deposition thickness of tantalum oxide was decreased, the surface area that can be obtained was increased. Accordingly, as the thickness of the tantalum oxide decreases, the equivalent oxide thickness decreases. Moreover, as shown in FIG. 11D, when the thickness of the tantalum oxide dielectric layer is in the range between about 110 Å and about 150 Å, the leakage current is unchanged or changes very little.

Based on the results of FIGS. 11A-11D, in some embodiments of the present invention, in order to apply a wrinkled electrode structure to a conventional integrated circuit memory device, the wrinkling of the surface of the ruthenium oxide layer may be maximized, but not to the extent that adjacent memory cells are directly in contact with one another. In addition, in some embodiments, the dielectric layer thickness may be minimized, but not to the extent that the device characteristics of the memory deteriorate. Finally, FIGS. 11C and 11D illustrate that the equivalent oxide thickness can be decreased to as low as 6 Å in some embodiments of the invention, without the need to use high dielectric constant materials.

According to some embodiments of the invention, the wrinkled layer includes a plurality of subhemispherical (i.e., less than a hemisphere) noble metal protrusions. In other embodiments, the wrinkled layer consists essentially of subhemispherical noble metal protrusions. In still other embodiments, the wrinkled layer is substantially free of superhemispherical (i.e., more than a hemisphere) noble metal protrusions. Stated differently, in some embodiments of the present invention, the wrinkled layer does not have a negative slope. This may contrast sharply with conventional hemispherical grain silicon electrode structures, wherein superhemispherical protrusions generally are found so that a negative slope is present over at least some portion of the superhemispherical protrusions. Since wrinkled layers according to some embodiments of the present invention can be free of superhemispherical protrusions, it may be easier to deposit a dielectric layer thereon with good step coverage. Moreover, the superhemispherical projections of conventional hemispherical grain silicon may cause adjacent grains to come into contact with one another, and thereby short circuit adjacent memory cells. In contrast, since a ruthenium oxide layer according to some embodiments of the invention is deposited to a predetermined thickness and then the volume and/or thickness is decreased, there can be little or no contact defects between the cells. Accordingly, wrinkling processes and wrinkled electrodes according to some embodiments of the present invention may have advantages compared to conventional hemispherical grain silicon fabrication processes and electrodes.

FIGS. 12A-12F, 13A-13F, 14A-14F, 15A-15E and 16A-16F and 17A-17F are side cross-sectional views of integrated circuit electrodes according to various embodiments of the invention during intermediate fabrication steps according to various embodiments of the present invention. In these embodiments, a first or lower electrode for an integrated circuit capacitor is formed by wrinkling a layer that comprises a noble metal oxide, such as ruthenium oxide, by removing at least some oxygen from the layer, to thereby produce a wrinkled layer. In these embodiments, the layer of ruthenium oxide may be formed by chemical vapor deposition, sputtering, by heat treating a ruthenium layer in an oxidizing atmosphere, for example at a temperature of 450° C. or greater, and/or by exposing the surface of a ruthenium layer to oxygen plasma. Other conventional techniques of forming a ruthenium oxide layer also may be used. When forming a ruthenium layer, a conventional Ru(EpCp)$_2$ metalorganic source and/or other conventional ruthenium source may be used. In FIGS. 12A-17F, the subsequent formation of a dielectric layer on the lower electrode and the formation of an upper electrode on the dielectric layer are not shown for simplicity. However, as was already described in connection with FIG. 1C, these layers may be formed via conventional techniques.

Figure 12A:
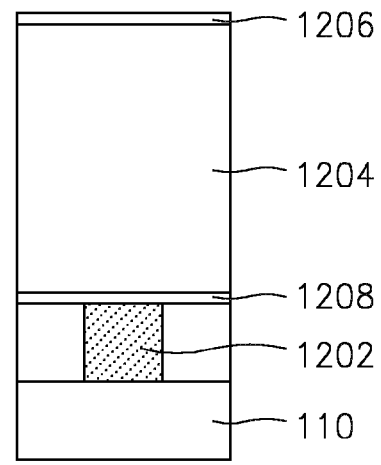
FIGS. 12A-12F, 13A-13F, 14A-14F, 15A-15E, 16A-16F and 17A-17F are side cross-sectional views of integrated circuit electrodes according to various embodiments of the invention during intermediate fabrication steps according to various embodiments of the present invention.

FIGS. 12A-12F are side cross-sectional views of integrated circuit electrodes according to some embodiments of the invention during intermediate fabrication steps according to some embodiments of the invention. In FIGS. 12A-12F, a concave-type electrode, for example for a Ru/TaOx/Ru capacitor, is manufactured. Referring now to FIG. 12A, a contact plug 1202 is formed on an integrated circuit substrate 110 and a dielectric layer 1204 and a cap 1206 are formed on the contact plug using conventional techniques. The dielectric layer 1204 also may be referred to as a mold oxide. The cap 1206 also may be referred to as a sacrificial oxide layer. An etch stop layer 1208 also may be formed.

Figure 12B:
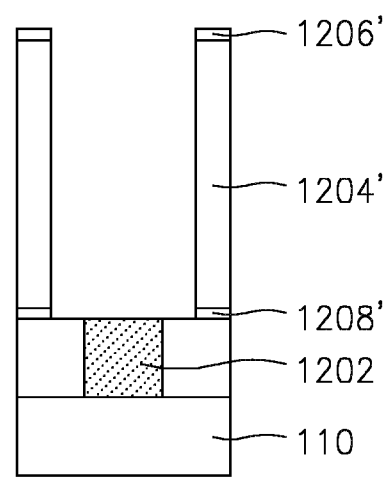

In FIG. 12B, the cap 1206, the dielectric layer 1204 and the etch stop 1208 are patterned to form a patterned cap 1206', a patterned dielectric layer 1204' and a patterned etch stop 1208', using conventional photolithography.

Figure 12C:
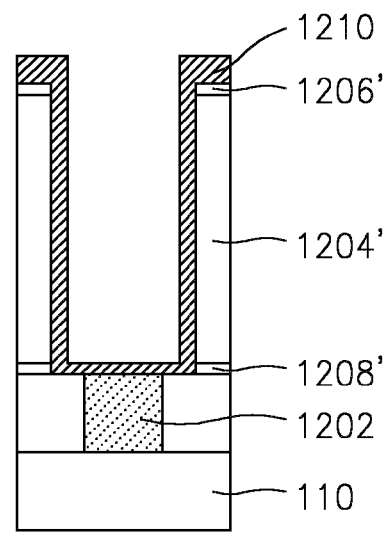
Figure 12D:
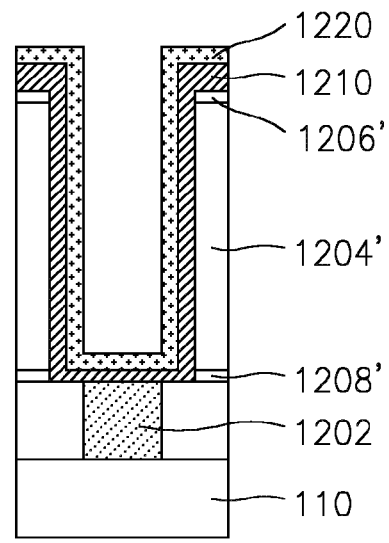
Figure 12E:
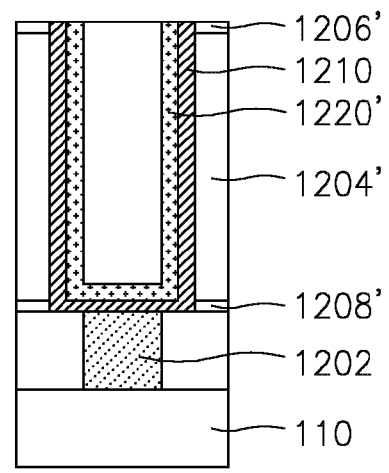

Referring now to FIG. 12C, a ruthenium layer 1210 is conformally deposited, for example by chemical vapor deposition. Then, referring to FIG. 12D, a ruthenium oxide layer 1220 is formed on the ruthenium layer 1210, for example by chemical vapor deposition. Then, in FIG. 12E, the top surfaces of the ruthenium oxide layer 1220 and the ruthenium layer 1210 are etched back using the patterned cap 1206' as an etch stop. Thus, a patterned ruthenium layer 1210' and a patterned ruthenium oxide layer 1220' that line the patterned dielectric layer 1204' are formed in FIG. 12E.

Figure 12F:
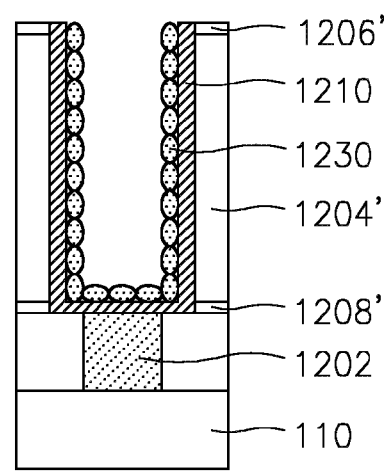

Referring now to FIG. 12F, the patterned ruthenium oxide layer 1220' is heat treated in a reducing atmosphere to produce a wrinkled ruthenium layer 1230. In FIG. 12F, all of the oxygen may be removed from the patterned ruthenium oxide layer 1220', to produce a wrinkled ruthenium layer 1230. A capacitor dielectric layer and a second (upper) electrode then may be formed using conventional techniques to complete a capacitor.

Figure 13A:
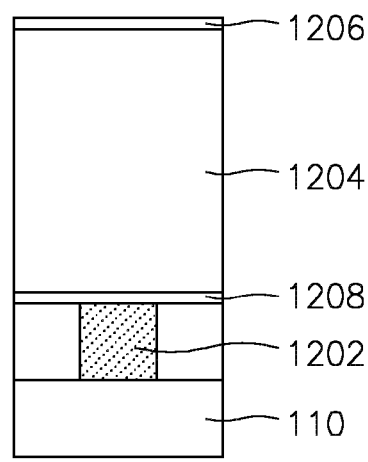
Figure 13B:
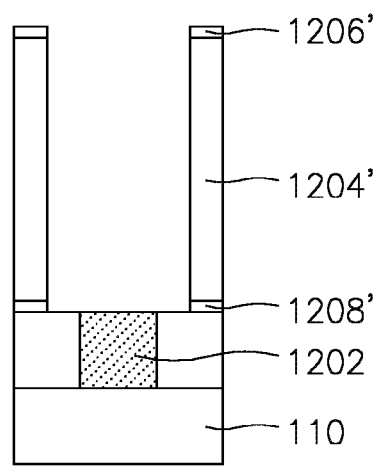
Figure 13C:
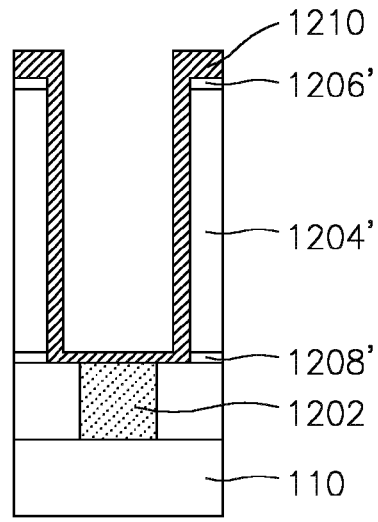
Figure 13D:
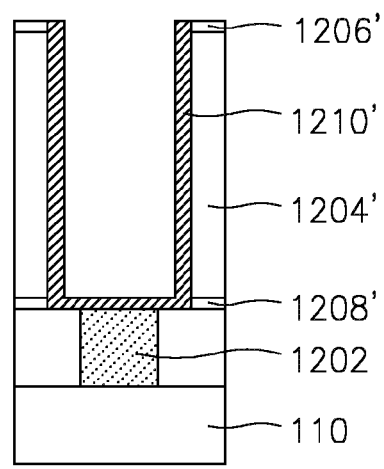

FIGS. 13A-13F are side cross-sectional views of integrated circuit electrodes according to other embodiments of the invention during intermediate fabrication steps according to other embodiments of the invention. FIGS. 13A-13C correspond to FIGS. 12A-12C and a description thereof will not be repeated for the sake of brevity. Referring now to FIG. 13D, the ruthenium layer 1210 is etched back to form a patterned ruthenium layer 1210' that lines the trench in the dielectric layer 1204'. Then, referring to FIG. 13E, the surface of the patterned ruthenium layer 1210' is heated, for example in an oxygen atmosphere, to oxidize the surface of the patterned ruthenium layer 1210' and, thus, form a patterned ruthenium oxide layer 1220''. Alternatively, the patterned ruthenium layer 1210' may be exposed to a plasma containing oxygen. Other techniques also may be used. Then, in FIG. 13F, the patterned ruthenium oxide layer 1220'' is heated in a reducing atmosphere to wrinkle the ruthenium oxide layer by removing at least some oxygen from the patterned ruthenium oxide layer, to thereby produce a wrinkled layer 1230. A dielectric layer and second (upper) electrode then may be formed using conventional techniques.

Figure 13E:
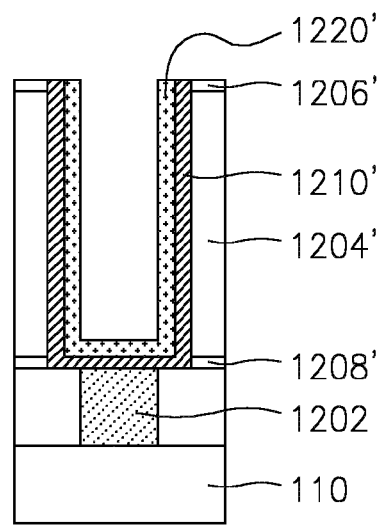
Figure 13F:
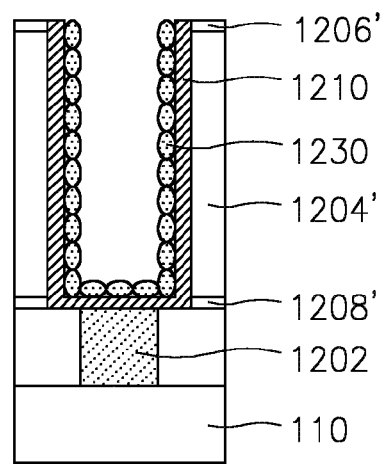

It will be understood that the sequence of operations performed in FIGS. 13E and 13F may be reversed. For example, a ruthenium oxide layer (not shown) may be formed on the wrinkled layer 1230 between the step of forming the wrinkled layer 1230 and the step of forming the dielectric layer.

Figure 14A:
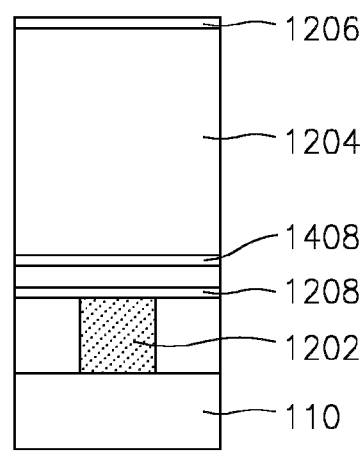
Figure 14B:
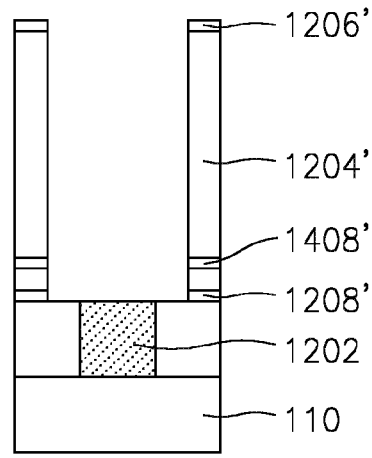

FIGS. 14A-14F are side cross-sectional views of integrated circuit electrodes according to other embodiments of the present invention during intermediate fabrication steps according to other embodiments of the present invention. In FIGS. 14A-14F, an electrode for a stack type capacitor (for example, a stack type Ru/TaOx/Ru capacitor) is fabricated. Referring to FIG. 14A, a sacrificial oxide layer 1206, a mold oxide 1204, an etch stop layer 1208, a second etch stop layer 1408, and a contact plug 1202 are fabricated on an integrated circuit substrate 110 using conventional techniques. In FIG. 14B, the mold oxide 1204 is patterned to form a capacitor node.

Figure 14C:
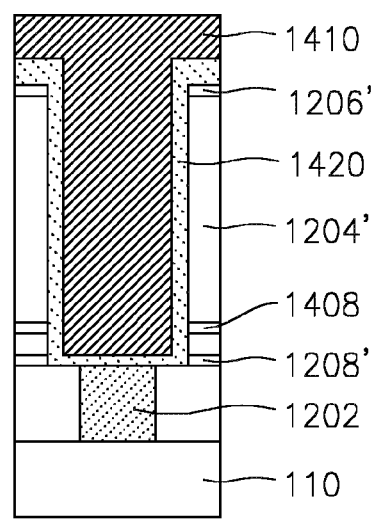

Referring now to FIG. 14C, a ruthenium oxide layer 1420 is then conformally deposited, for example by chemical vapor deposition. A ruthenium layer 1410 is then formed on the ruthenium oxide layer 1420, for example by chemical vapor deposition.

Figure 14D:
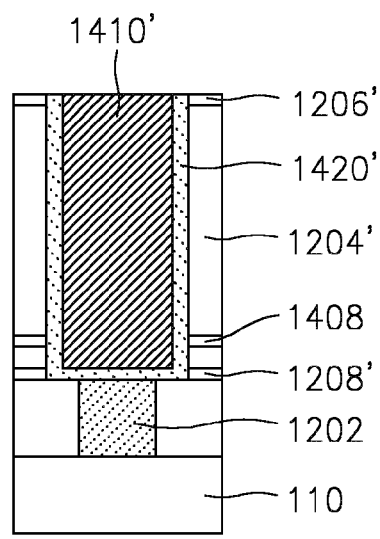
Figure 14E:
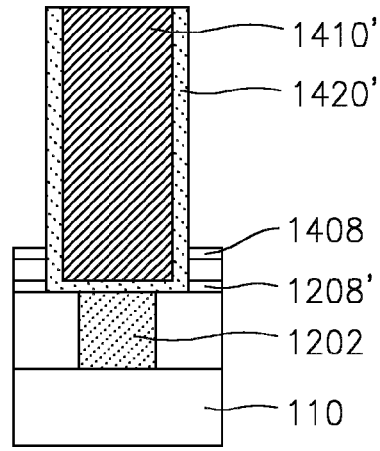
Figure 14F:
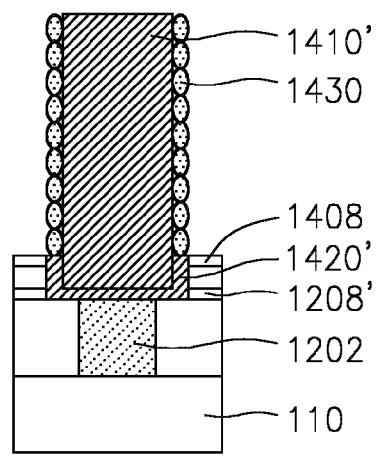

Then, in FIG. 14D, the ruthenium oxide layer 1420 and ruthenium layer 1410 are etched back using the patterned sacrificial oxide layer 1206' to form a patterned ruthenium oxide layer 1420' and a patterned ruthenium layer 1410'. Then, in FIG. 14E, the patterned mold oxide 1204' is removed, for example by wet etching, to form a stacked storage node, using the patterned second etch stop layer 1408'. Finally, in FIG. 14F, the stacked storage node is heated in a reducing atmosphere to wrinkle the patterned layer comprising ruthenium oxide 1420', for example to remove all of the oxygen therefrom, and thereby produce a wrinkled ruthenium layer 1430. A dielectric layer and second (upper) electrode then may be formed using conventional techniques.

Figure 15A:
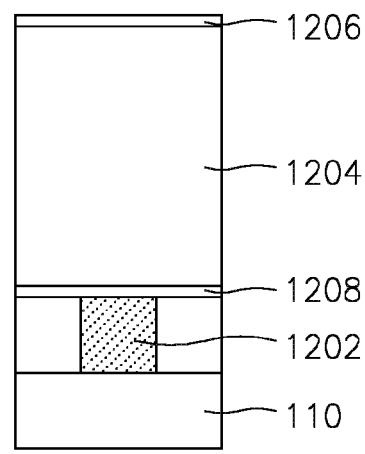
Figure 15B:
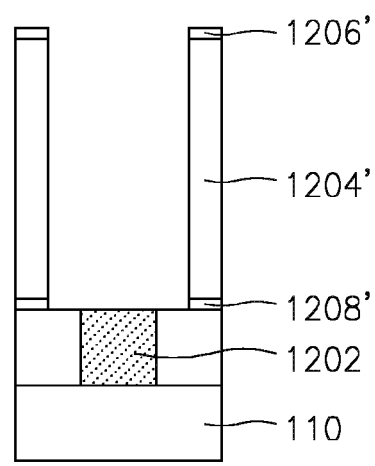
Figure 15C:
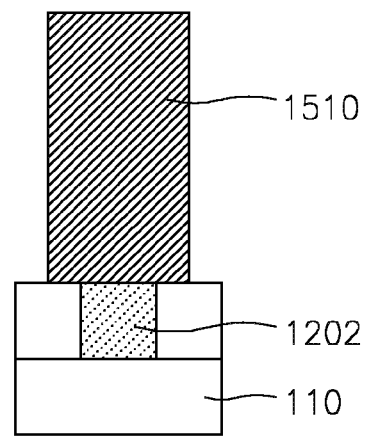

FIGS. 15A-15E illustrate integrated circuit electrodes according to other embodiments of the present invention during intermediate fabrication steps according to other embodiments of the present invention. In FIGS. 15A-15E, an electrode for a stack type capacitor such as a stack type Ru/TaOX/Ru capacitor, is fabricated. The operations of FIGS. 15A and 15B correspond to FIGS. 12A and 12B and a description thereof will not be repeated for the sake of brevity. Then, as shown in FIG. 15C, a ruthenium layer 1510 is deposited, for example by chemical vapor deposition and etched back using the sacrificial oxide layer 1206'. Then the patterned mold oxide layer 1204' is removed, for example by wet etching, to form a stacked storage node.

Figure 15D:
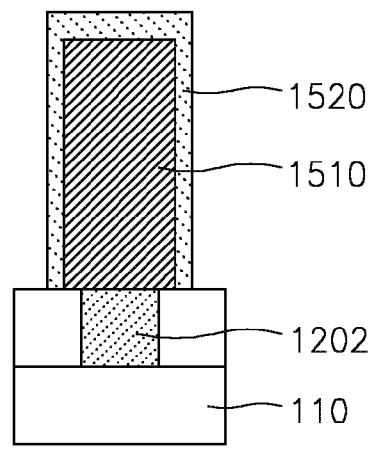
Figure 15E:
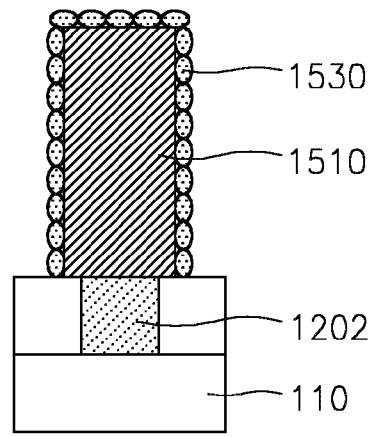

Then, in FIG. 15D, the surface of the ruthenium layer 1510 is heat treated in an oxygen atmosphere and/or exposed to a plasma containing oxygen to oxidize the surface of the ruthenium layer to form a ruthenium oxide layer 1520. Finally, in FIG. 15E, a wrinkled ruthenium layer 1530 is formed from the ruthenium oxide layer 1520 by heat treating in a reducing atmosphere, to remove all of the oxygen from the ruthenium oxide layer. A dielectric layer and second (upper) electrode then may be formed using conventional techniques.

FIGS. 16A-16F illustrate other integrated circuit electrodes according to other embodiments of the present invention during intermediate fabrication steps according to other embodiments of the present invention. Embodiments of FIGS. 16A-16F may be used to form an electrode for a cylinder-type capacitor such as a Ru/TaOx/Ru cylinder-type capacitor. The operations of FIGS. 16A and 16B correspond to FIGS. 12A and 12B and will not be repeated for the sake of brevity.

Figure 16A:
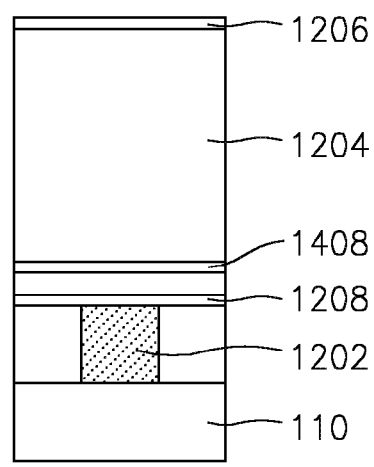
Figure 16B:
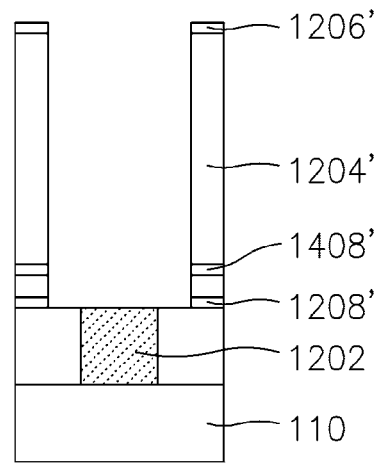
Figure 16C:
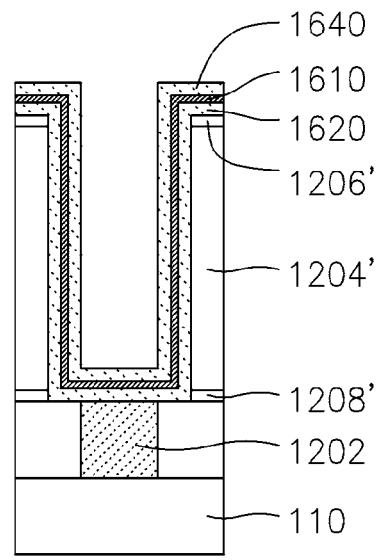
Figure 16D:
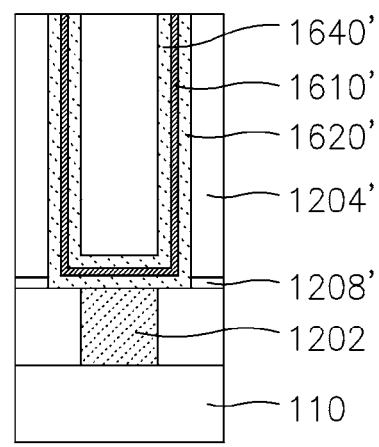

Referring now to FIG. 16C, a first ruthenium oxide layer 1620 is conformally deposited by chemical vapor deposition. A ruthenium layer 1610 then is deposited on the first ruthenium oxide layer 1620, for example by chemical vapor deposition. A second ruthenium oxide layer 1640 then is deposited on the ruthenium layer 1610 by chemical vapor deposition. In FIG. 16B, the ruthenium and ruthenium oxide layers 1610, 1620 and 1640 then are etched back using the sacrificial oxide layer 1206' to form a first patterned ruthenium oxide layer 1620', a patterned ruthenium layer 1610' and a second patterned ruthenium oxide layer 1640'.

Figure 16E:
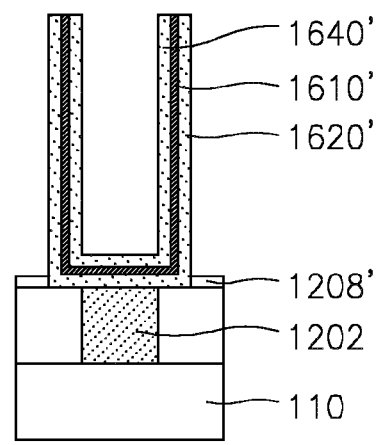
Figure 16F:
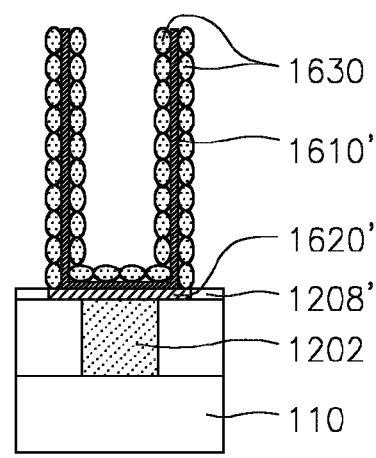

Referring now to FIG. 16E, the patterned mold oxide 1204' is then removed, for example by a wet etching, to form a cylinder-type storage node. Finally, referring to FIG. 16F, the surface of the first and second ruthenium layers 1620' and 1640' are then heat treated in a reducing atmosphere, to thereby form a wrinkled ruthenium layer 1630 on both sides of the patterned ruthenium layer 1610'. A dielectric layer and second (upper) electrode then may be formed using conventional techniques.

According to other embodiments of the invention, the first layer 1620 and the second layer 1640 may be of different compositions from one another in FIG. 16C. Thus, upon heat treatment in FIG. 16F, differing amounts of wrinkling may be obtained for the wrinkled layer 1630 on either side of the patterned ruthenium layer 1610'. Differential wrinkling may be obtained, according to some embodiments of the present invention, by using different noble metals for each of the first and second layers 1620', 1640'. In other embodiments, differential wrinkling may be obtained by changing the relative oxygen component "x" in the RuOx. For example, in some embodiments, as the "x" increases, the wrinkling may increase and as "x" decreases, the wrinkling may decrease (the surface becomes smoother).

FIGS. 17A-17F illustrate other embodiments of integrated circuit electrodes according to other embodiments of the present invention during intermediate fabrication steps according to other embodiments of the present invention. The operations of FIGS. 17A-17F may be used to fabricate an electrode for a cylinder-type capacitor, such as a cylinder-type RuOx/Ru/RuOx capacitor, according to embodiments of the present invention. The operations of FIGS. 17A and 17B correspond to FIGS. 16A and 16B, and will not be described again for the sake of brevity.

Figure 17A:
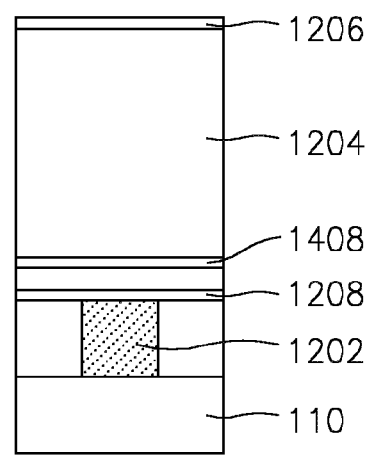
Figure 17B:
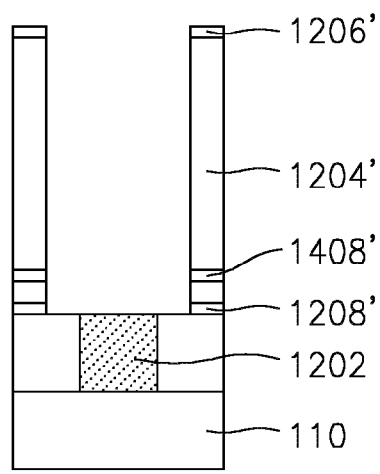
Figure 17C:
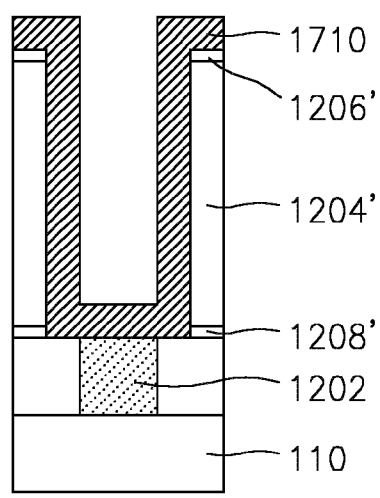
Figure 17D:
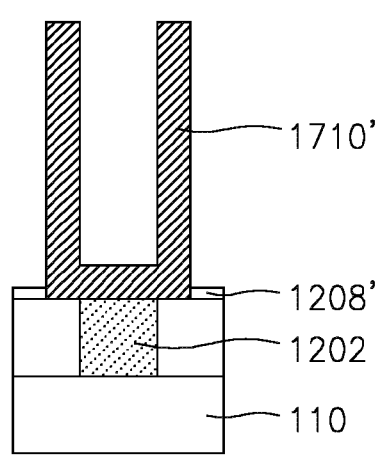

Then, referring to FIG. 17C, a ruthenium layer 1710 is deposited by chemical vapor deposition and then etched back using the sacrificial oxide layer 1206' to form a patterned ruthenium layer. Referring now to FIG. 17D, the mold oxide layer is then etched away, for example by wet etching, so that the patterned ruthenium layer 1710' forms a cylinder-type ruthenium storage node. Then, referring to FIG. 17E, the surface of the patterned ruthenium layer 1710' is heated in an oxygen atmosphere and/or exposed to an oxygen-containing plasma, to oxidize the surface of the patterned ruthenium layer 1710' and thereby form a ruthenium oxide layer 1720. Finally, referring to FIG. 17F, the structure is then heated in a reducing atmosphere to remove all of the oxide from the ruthenium oxide layer 1720 to form a wrinkled layer 1730 comprising ruthenium. A dielectric layer and second (upper) electrode then may be formed using conventional techniques.

Figure 17E:
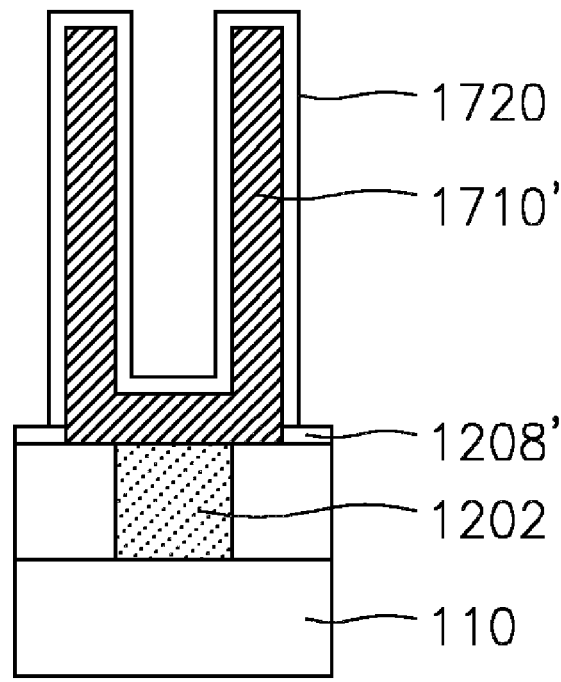
Figure 17F:
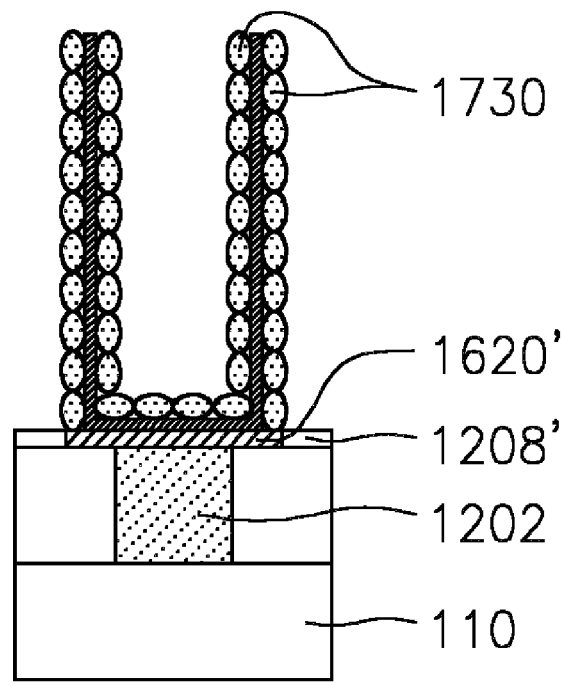

In yet other embodiments of the present invention, a cylinder-type capacitor may be fabricated wherein the inner cylinder surface comprises a wrinkled ruthenium layer, but the outer cylinder surface comprises a smooth ruthenium layer or a ruthenium layer that is wrinkled less than the inner cylinder surface. More specifically, in these embodiments, at FIG. 17D, the mold oxide layer is not etched away but, rather, remains, so that in FIG. 17D, the patterned ruthenium layer 1710' only is formed on the inner surface of the cylinder-type ruthenium storage node. In FIG. 17E, the surface of the patterned ruthenium layer 1710' is heated in an oxygen atmosphere, and/or exposed to an oxygen-containing plasma, to oxidize the surface of the patterned ruthenium layer 1710', and thereby form a ruthenium oxide layer 1720 on the inner surface of the cylinder. Since the mold oxide 1204 was not removed from the outer surface of the cylinder, the outer surface is not wrinkled but, rather, is smooth. Thus, in these embodiments, contact between adjacent devices can be reduced or prevented.

Figure 18A:
FIGS. 18A-18D are top perspective images of ruthenium and ruthenium oxide layers before and after hydrogen annealing according to some embodiments of the present invention.
Figure 18B:
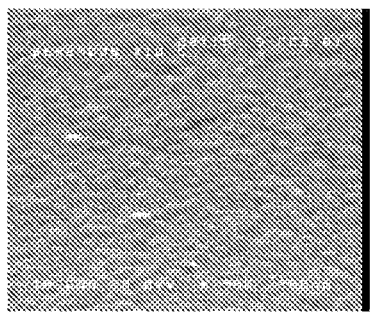
Figure 18C:
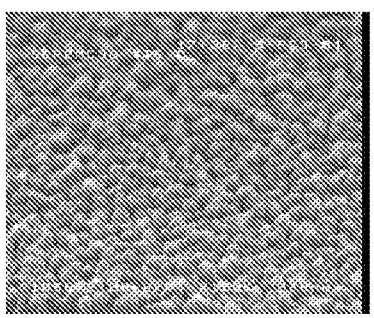
Figure 18D:
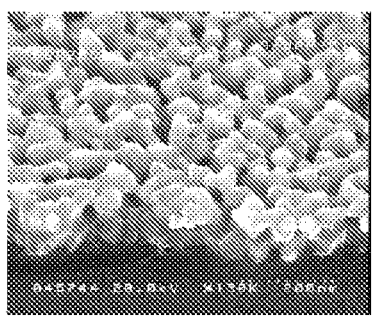
Figure 19:
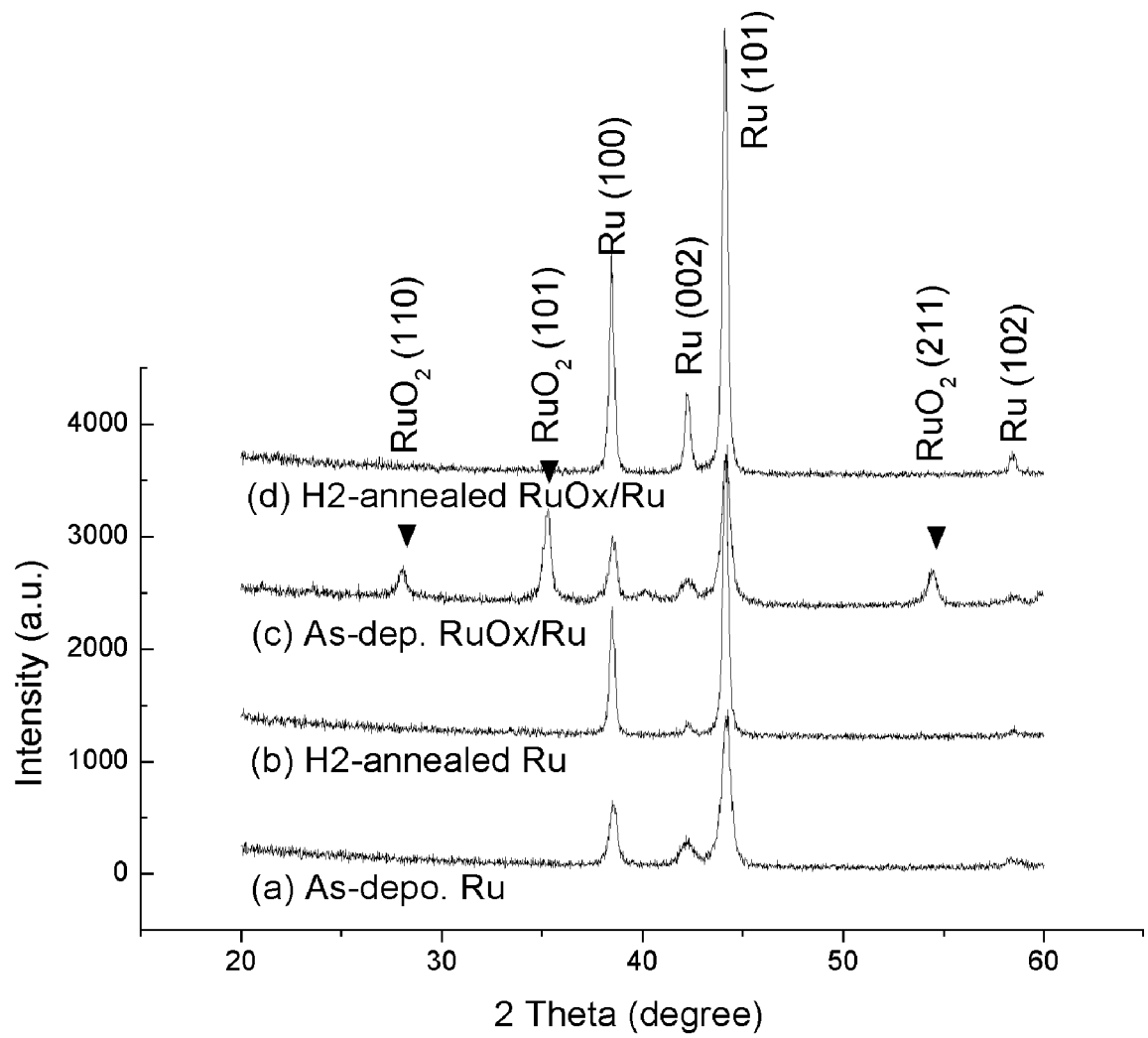
FIG. 19 graphically illustrates compositions of wrinkled layers according to some embodiments of the present invention.

Other examples that illustrates wrinkling of a ruthenium oxide layer according to embodiments of the present invention now will be provided. To obtain these examples, ruthenium oxide films were deposited on a TaOx/SiO$_2$/Si substrate by chemical vapor deposition using Ru(EtCp)$_2$: bis-(ethylcyclopentadieny)ruthenium precursors and annealed at 450° C. for 30 minutes in 90% N$_2$-10% H$_2$. FIGS. 18A-18D are top perspective SEM images of Ru and RuOx/Ru films before (FIGS. 18A and 18C) and after (18B and 18D) hydrogen annealing. As shown in FIGS. 18A and 18B, the morphology of Ru films was almost constant regardless of hydrogen annealing. In contrast, as shown in FIGS. 18C-18D, RuOx films were dramatically wrinkled by hydrogen annealing. From x-ray diffraction (XRD) analysis shown in FIG. 19, the wrinkled films were identified as ruthenium metal films that were formed by reduction of ruthenium oxide films.

Figure 20:
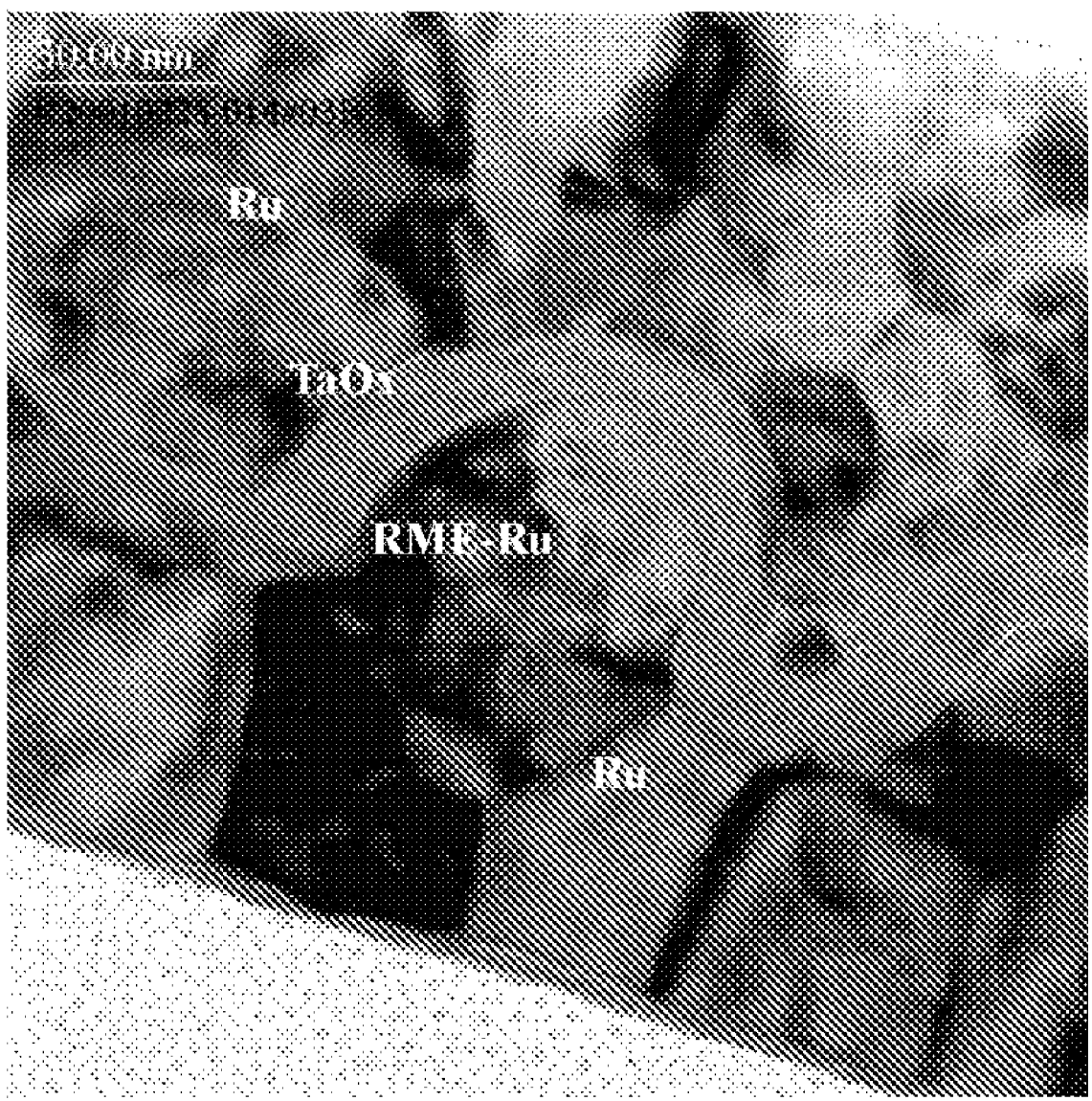
FIG. 20 is a side cross-sectional image of a ruthenium/tantalum oxide/wrinkled ruthenium capacitor according to some embodiments of the present invention.

FIG. 20 is a Transmission Electron Microscope (TEM) image of a wrinkled Ru/TaOx/Ru capacitor. As shown in this embodiment, the wrinkled ruthenium layer provides sub-hemispherical ruthenium protrusions. Thus, in this embodiment, the wrinkled ruthenium layer does not have the negative slope that is associated with hemispherical grain silicon structures. This lack of a negative slope in some embodiments of the invention can improve the conformal step coverage of dielectric films and/or reduce reliability problems as was already described.

Embodiments of the invention that were described above have wrinkled a layer comprising noble metal oxide by removing at least some oxygen from the layer comprising noble metal oxide, to thereby produce a wrinkled layer.

Other embodiments for producing a wrinkled layer now will be described. In these embodiments, an integrated circuit electrode is fabricated by forming a layer comprising metal and another constituent other than oxygen on an integrated circuit substrate. The layer comprising metal and another constituent other than oxygen is then wrinkled by removing at least some of the other constituent from the layer comprising metal and another constituent other than oxygen, to thereby produce the wrinkled layer. In particular, in some embodiments, it has been realized that when a noble metal layer is deposited by chemical vapor deposition, the deposition may be configured so that noble metal layer may contain a considerable number of carbon atoms. These carbon atoms can be effectively exhausted by heat treatment. When the carbon atoms are exhausted, the volume of the noble metal layer decreases and, as a result, the surface of the noble metal layer may become wrinkled.

Figure 21A:
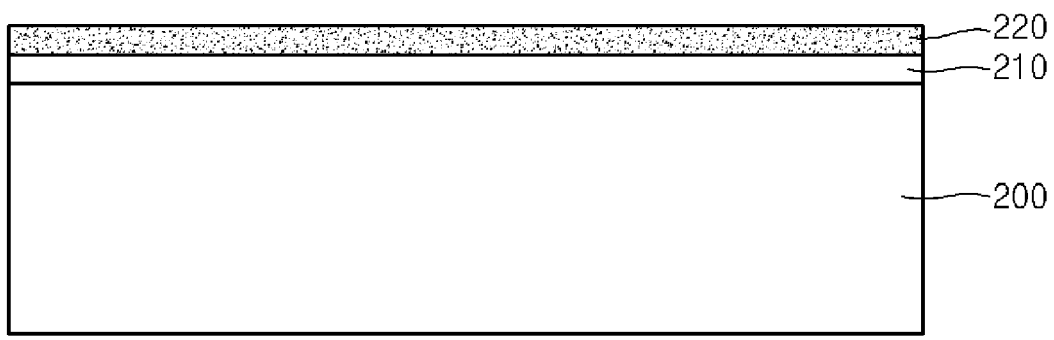
FIGS. 21A and 21B are side cross-sectional views of wrinkled ruthenium layers according to some embodiments of the present invention during intermediate fabrication steps according to embodiments of the present invention.
Figure 25:
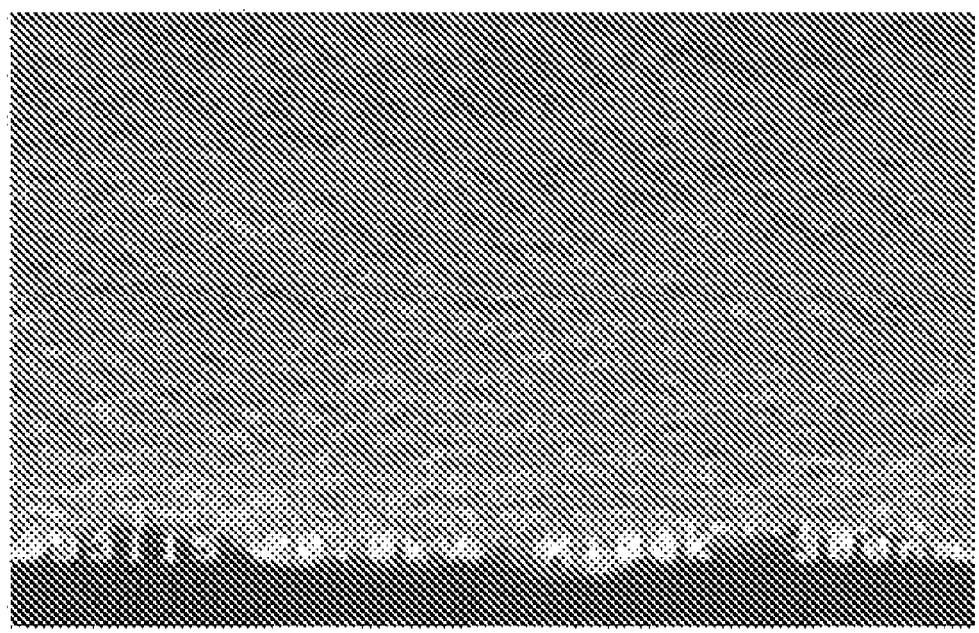
FIG. 25 is a top perspective image illustrating a thermally treated surface of a ruthenium layer containing a low amount of carbon atoms according to some embodiments of the present invention.

Thus, referring to FIG. 21A, a first conductive layer 210 is formed on an integrated circuit substrate 200. The first conductive layer 210 may be formed of Ru. Alternatively, the first conductive layer 210 may be formed of a noble metal, such as Pt and/or Ir, a noble metal oxide, such as RuOx, IrOx, SRO, BSRO, and/or LSCo, and/or a material comprising refractory metal, such as Ti, TiN, W, WN, Ta, TaN, HfN, ZrN, TiAlN, TaSiN, TiSiN, and/or TaAlN. In some embodiments, the first conductive layer 210 contains about 0.01% to about 10% of carbon, and, in some embodiments, about 0.01% to about 1% of carbon, and may be formed by CVD (chemical vapor deposition) and/or ALD (atomic layer deposition) by using a metal source and an oxygen source. As described above, a conductive layer formed using a general method of supplying a metal source and a sufficient amount of oxygen source may have less than about 10% of impurities. The first conductive layer 210, having a low amount of impurities, particularly, carbon, is hardly changed in size during heat treatment. During the heat treatment, the surface of the first conductive layer 210 is smooth as illustrated in FIG. 25.

Referring again to FIG. 21A, a second conductive layer 220 is formed with a considerable amount of impurities, on the first conductive layer 210. In some embodiments, the second conductive layer 220 includes about 20% to about 50% of carbon. Like the first conductive layer 210, the second conductive layer 220 may be formed of a noble metal, such as Pt and/or Ir, a noble metal oxide such as RuOx, IrOx, SRO, BSRO, and/or LSCo, and/or a material comprising refractory metal, such as Ti, TiN, W, WN, Ta, TaN, HfN, ZrN, TiAlN, TaSiN, TiSiN, and/or TaAlN. The second conductive layer 220 may be formed of a material identical to or different than that of the first conductive layer 210.

Many techniques may be used, according to various embodiments of the invention, to form the second conductive layer to include between about 20% and about 50% of carbon. The second conductive layer 220, including the considerable number of impurities, may be formed by CVD at about 100° C. to about 300° C. When the second conductive layer 220 is formed by CVD at a low temperature of about 100° C. to about 300° C., a metal source is not actively dissolved, so that the amount of impurities, such as carbon, contained in the second conductive layer 220 may be increased.

The second conductive layer 220 may also be formed by CVD and/or ALD by using only a metal source without using an oxygen source. In ALD using only a metal source, the second conductive layer 220 can be formed by only performing the operations of supplying a metal source and purging the metal source. In such an ALD, an oxygen gas that dissolves the metal source is not supplied, so that the amount of carbon contained in the second conductive layer 220 may be increased. In addition, when the second conductive layer 220 is formed, a β-diketon-base or carbonyl-base source having a higher carbon content than the other sources may be used. When the second conductive layer 220 is formed by ALD by using a metal source and an oxygen source, a tetrahydrofuran (THF) solvent may be further supplied in order to increase carbon content.

Figure 26:
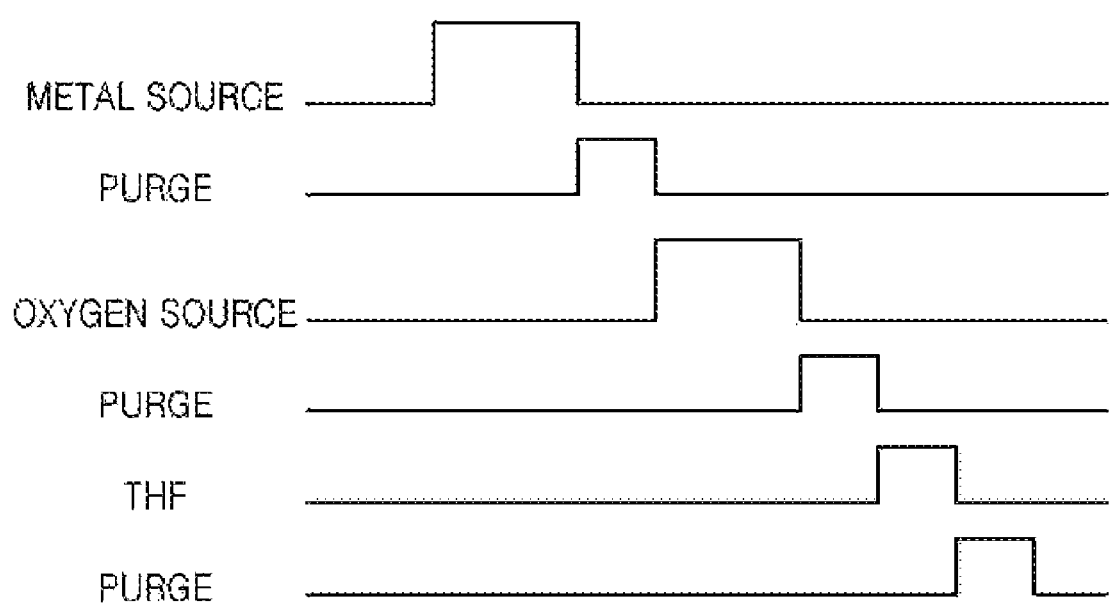
FIG. 26 is timing chart illustrating a deposition cycle of a conductive layer containing a considerable number of carbon atoms according to some embodiments of the present invention.

In other words, a method of forming the second conductive layer 220 using a THF solvent may include, as illustrated in FIG. 26, an operation of supplying a metal source, an operation of purging at least some metal atoms of the metal source that are not chemically adsorbed to the metal atoms, an operation of supplying an oxygen source, an operation of purging at least some oxygen atoms of the oxygen source that are not chemically adsorbed to the other chemically adsorbed metal atoms, an operation of supplying a THF solvent, and an operation of purging at least some of the THF solvent. Since the THF solvent also contains a large amount of carbon, the formation of the second conductive layer 220 using the THF solvent contributes to increasing the carbon content of the second conductive layer 220.

Figure 21B:
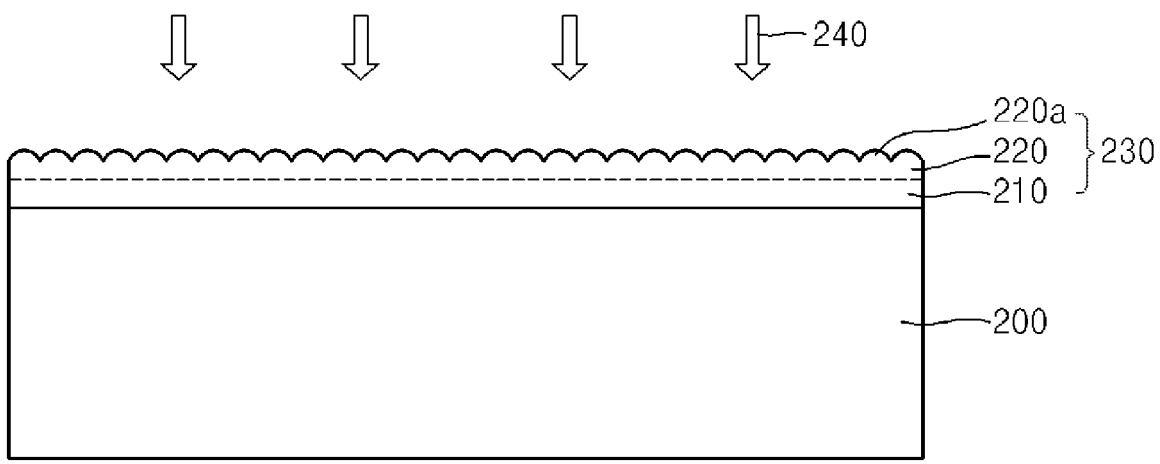

Next, as illustrated in FIG. 21B, a heat treatment 240 is executed to exhaust at least some carbon from the second conductive layer 220. Like the heat treatment performed to form wrinkles, the heat treatment 240 may be conducted in a reducing atmosphere capable of inducing a reaction with the carbon, such as an $H_2$ and/or $N_2$ gas atmosphere and/or a vacuum atmosphere of about 0.01 to about 10 mTorr. In order to reduce the thermal burden of the integrated circuit substrate 200 below the first conductive layer 210, the heat treatment 240 may be conducted at low temperatures of about 300° C. to about 500° C. In some embodiments, a sufficient number of impurities may be exhausted even by a low-temperature heat treatment at about 500° C. or lower, because the second conductive layer 220 includes an excess amount of carbon. When this heat treatment 240 is conducted, wrinkles (i.e., a morphology) 220a are formed on the second conductive layer 220. In some embodiments, only the morphology of the second conductive layer 220 is changed and the material properties thereof are not changed, because the heat treatment 240 is configured to remove impurities, such as, carbon, from the second conductive layer 220.

In some embodiments, the wrinkles 220a are produced when impurities more than a threshold, such as more than about 50% of the impurities, are exhausted. In other words, when a conductive layer is formed using a general method like the first conductive layer 210, small amounts of impurities are exhausted, so that the conductive layer is not wrinkled as illustrated in FIG. 25 even when undergoing heat treatment under the reducing atmosphere or the vacuum atmosphere. On the other hand, when a conductive layer has an impurity content of about 20% or more like the second conductive layer 220, a great number of impurities, for example, at least about 50% of the original impurities, are exhausted during heat treatment 240, so that the uniform wrinkles 220a may be formed on the surface of the conductive layer. In other embodiments, sufficient impurities are exhausted, such that less than about 10% impurities remain in the second conductive layer. Accordingly, wrinkling may be produced by exhausting at least about 50% of the carbon and/or exhausting sufficient carbon so that less than about 10% carbon remains in the second conductive layer 220. In some embodiments, up to 99.8% of the original impurities may be exhausted. The wrinkles 220a may form partially discontinuous regions according to the degree of exhaustion of impurities. However, electrical isolation of the discontinuous regions need not occur because the first conductive layer 210, not being substantially affected by heat treatment, exists below the wrinkles 220a. In FIG. 21B, reference numeral 230 denotes a lower electrode made up of the first conductive layer 210 and the second conductive layer 220 having the wrinkles 220a. It will be understood that the lower electrode 230 may have a cylindrical and/or other shape.

Figure 22A:
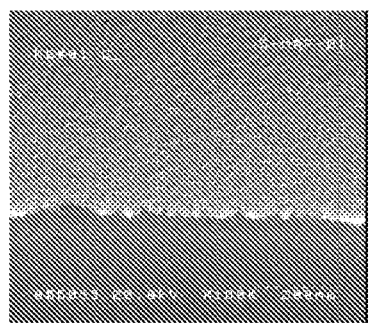
FIGS. 22A and 22B are top perspective images of a ruthenium layer and a wrinkled ruthenium layer respectively, according to some embodiments of the present invention.
Figure 22B:
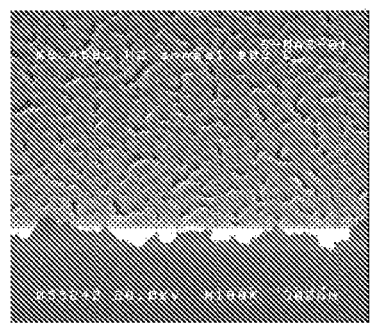

FIG. 22A is an SEM image of a top perspective view of a ruthenium layer having a thickness of 250 Å that is formed on a silicon dioxide layer on a silicon substrate. As shown, the morphology is not wrinkled. In sharp contrast, FIG. 22B is an SEM image of a top perspective view of a ruthenium layer obtained by injecting a considerable amount of carbon, for example, about 20% to about 50%, into a ruthenium film and heat treating under a hydrogen atmosphere at about 450° C. for about 30 minutes. Referring to FIG. 22B, the ruthenium layer has a thickness reduced about 150 Å compared with the ruthenium layer of FIG. 22A by heat treatment, and the ruthenium layer has a uniformly wrinkled surface.

Figure 23A:
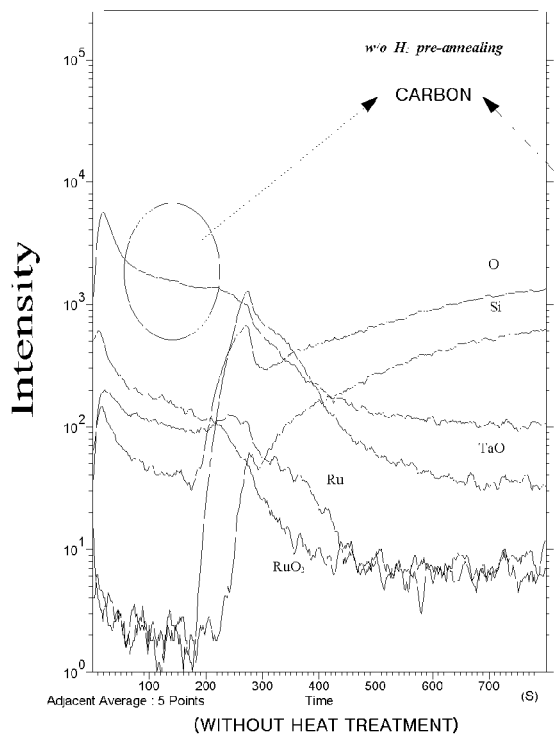
FIGS. 23A and 23B are depth profiles of ruthenium layers prior to heat treatment and after heat treatment according to some embodiments of the present invention.
Figure 23B:
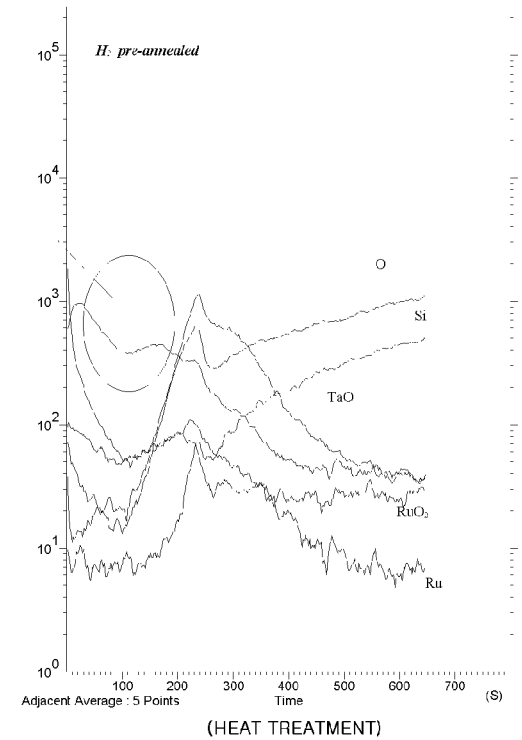

FIGS. 23A and 23B are SIMS depth profiles of the ruthenium layer prior to heat treatment (FIG. 22A) and after heat treatment (FIG. 22B). As shown, the carbon concentration of FIG. 23A decreases markedly in FIG. 23B after heat treatment. Accordingly, a layer comprising metal and another constituent other than oxygen can be wrinkled by removing at least some of the other constituent from the layer, to thereby produce a wrinkled layer.

Figure 24A:
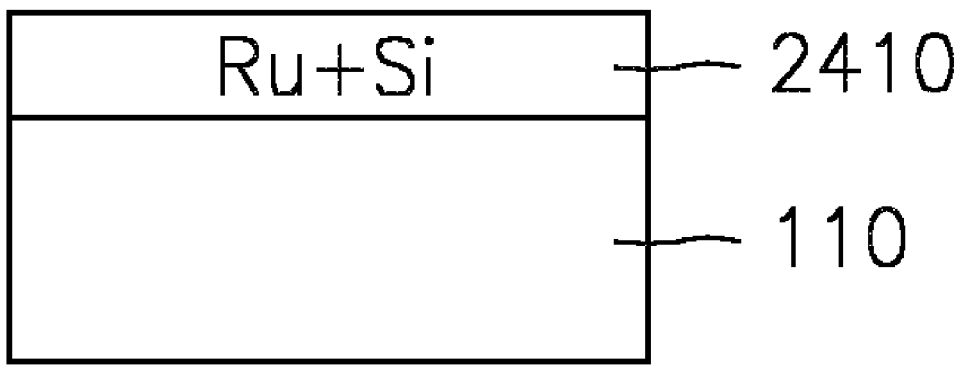
FIGS. 24A and 24B are side cross-sectional views of wrinkled ruthenium layers according to other embodiments of the present invention during intermediate fabrication steps according to other embodiments of the present invention.
Figure 24B:
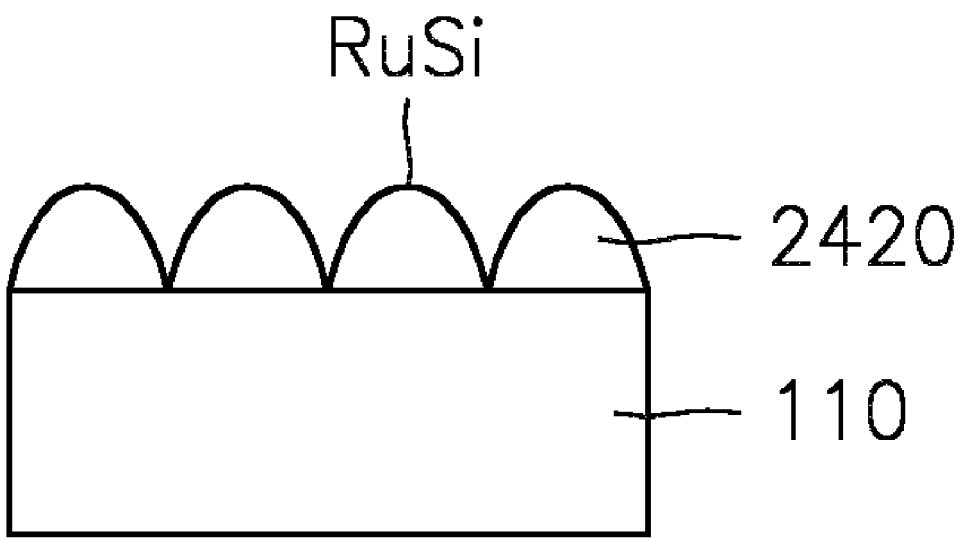

FIGS. 24A and 24B illustrate yet other embodiments of the present invention. In these embodiments, a layer comprising metal and another constituent is formed on an integrated circuit substrate. The layer comprising metal and another constituent is then wrinkled by reacting at least some of the metal with at least some of the other constituent, to form a compound of the metal and the other constituent, and thereby produce a wrinkled layer.

In the embodiments shown in FIGS. 24A and 24B, the metal comprises a noble metal such as ruthenium, and the other constituent comprises silicon. The wrinkling comprises heat treating a layer comprising noble metal and silicon, to react at least some of the noble metal with at least some of the silicon to form a noble metal silicide.

Thus, as shown in FIG. 24A, a layer 2410 that comprises ruthenium and silicon is formed on an integrated circuit substrate 110. An anneal is then performed, for example at 450° C. in nitrogen for thirty minutes, to react the ruthenium and the silicon, and thereby form a wrinkled layer 2420 comprising ruthenium silicide (RuSi). As shown in FIG. 24B, due to the volume decrease in forming the compound, the wrinkled layer 2420 comprising ruthenium silicide is then formed. It will be understood that additional silicon may be provided in the ruthenium layer using diffusion and/or other techniques. However, as was already shown in FIGS. 23A and 23B, silicon already may be present in a ruthenium layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an electrode, comprising:
   forming a first conductive layer;
   forming a second conductive layer on the first conductive layer, wherein the second conductive layer comprises about 20% to about 50% carbon; and
   exhausting at least some of the carbon from the second conductive layer by heat treating the second conductive layer, to wrinkle a surface of the second conductive layer due to the exhaustion of at least some of the carbon from the second conductive layer.

2. The method of claim 1, wherein the forming of the second conductive layer comprises chemical vapor depositing the second conductive layer at about 100° C. to about 300° C.

3. The method of claim 1, wherein the forming of the second conductive layer comprises supplying only a metal source.

4. The method of claim 3, wherein the forming of the second conductive layer comprises atomic layer depositing the second conductive layer.

5. The method of claim 1, wherein the forming of the second conductive layer comprises supplying a metal source, an oxygen source, and a tetrahydrofuran solvent.

6. The method of claim 5, wherein the forming of the second conductive layer comprises atomic layer depositing the second conductive layer.

7. The method of claim 1, wherein the first conductive layer has less than about 10% carbon content.

8. The method of claim 1, wherein the heat treating is conducted under a reducing atmosphere including $H_2$ and/or $N_2$ gas.

9. The method of claim 1, wherein the heat treating is conducted under a vacuum atmosphere of about 0.01 mTorr to about 10 mTorr.

10. The method of claim 1, wherein the heat treating is conducted at about 300° C. to about 500° C.

11. The method of claim 7, wherein the first conductive layer has between about 0.01% to about 10% carbon content.

12. The method of claim 1, wherein the electrode is a capacitor lower electrode.

13. The method of claim 1, wherein the exhausting of at least some of the carbon comprises exhausting at least some of the carbon from the second conductive layer so that less than about 10% carbon remains in the second conductive layer.

14. The method of claim 1 wherein the exhausting of at least some of the carbon comprises exhausting at least about 50% of the carbon in the second conductive layer.

15. A method of fabricating a capacitor, comprising:
   forming a first lower electrode layer on a substrate;
   forming a second lower electrode layer on the first lower electrode layer, wherein the second lower electrode layer comprises about 20% to about 50% carbon;
   forming a lower electrode having a wrinkled surface by exhausting at least some of the carbon from the second lower electrode layer, wherein the lower electrode comprises the first lower electrode and the second lower electrode having a wrinkled surface;
   forming a dielectric film on the wrinkled surface of the lower electrode; and
   forming an upper electrode on the dielectric film.

16. The method of claim 15, wherein the forming of the second lower electrode layer comprises chemical vapor depositing the second lower electrode layer at about 100° C. to about 300° C.

17. The method of claim 15, wherein the forming of the second lower electrode layer comprises atomic layer depositing the second lower electrode layer by supplying a metal source and purging the metal source.

18. The method of claim 15, wherein the forming of the second lower electrode layer comprises:
supplying a metal source to a surface of the first lower electrode layer;
purging at least some atoms of the metal source that are not chemically adsorbed to the first lower electrode;
supplying an oxygen gas to the other metal atoms that are chemically adsorbed to the first lower electrode;
purging at least some atoms of the oxygen source that are not chemically adsorbed to the metal atoms;
supplying a tetrahydrofuran solvent to at least some of the other chemically adsorbed atoms of the oxygen gas; and
purging at least some of the tetrahydrofuran solvent.

19. The method of claim 15, wherein the first lower electrode layer has a carbon content of less than about 10% so that the first lower electrode layer does not substantially decrease in size by heat treatment.

20. The method of claim 15, wherein the exhausting of at least some of the carbon from the second lower electrode layer comprises heat treating the second lower electrode layer at about 300° C. to about 500° C. under a reducing atmosphere including $H_2$ and/or $N_2$ gas.

21. The method of claim 15, wherein the exhausting of at least some of the carbon from the second lower electrode layer comprises heat treating the second lower electrode layer at about 300° C. to about 500° C. under a vacuum atmosphere of about 0.01 mTorr to about 10 mTorr.

22. The method of claim 15, wherein the first lower electrode layer, the second lower electrode layer, and/or the upper electrode comprises a noble metal, a noble metal oxide, and/or a refractory material, and
wherein the noble metal comprises Pt, Ru, and/or IR, the noble metal oxide comprises RuOx, IrOx, SRO, BSRO, and/or LSCo, and the refractory material comprises Ti, TiN, W, WN, Ta, TaN, HfN, ZrN, TiAlN, TaSiN, TiSiN, and/or TaAlN.

23. The method of claim 15, wherein the exhausting of at least some of the carbon comprises exhausting at least some of the carbon from the second lower electrode layer so that less than about 10% carbon remains in the second lower electrode layer.

24. The method of claim 15, wherein the exhausting of at least some of the carbon comprises exhausting at least about 50% of the carbon in the second conductive layer.

25. A method of fabricating an integrated circuit electrode, comprising:
forming a conductive layer on an integrated circuit substrate, wherein the conductive layer comprises about 20% to about 50% carbon; and
exhausting at least some of the carbon from the conductive layer by heat treating the conductive layer to wrinkle a surface of the conductive layer due to the exhaustion of at least some of the carbon from the conductive layer.

26. The method of claim 25, wherein the forming of the conductive layer comprises chemical vapor depositing the conductive layer at about 100° C. to about 300° C.

27. The method of claim 25, wherein the forming of the conductive layer comprises supplying only a metal source.

28. The method of claim 27, wherein the forming of the conductive layer comprises atomic layer depositing the conductive layer.

29. The method of claim 25, wherein the forming of the conductive layer comprises supplying a metal source, an oxygen source, and a tetrahydrofuran solvent.

30. The method of claim 29, wherein the forming of the conductive layer comprises atomic layer depositing the conductive layer.

31. The method of claim 25, wherein the heat treating is conducted under a reducing atmosphere including $H_2$ and/or $N_2$ gas.

32. The method of claim 25, wherein the heat treating is conducted under a vacuum atmosphere of about 0.01 mTorr to about 10 mTorr.

33. The method of claim 25, wherein the heat treating is conducted at about 300° C. to about 500° C.

34. The method of claim 25, wherein the exhausting of at least some of the carbon comprises exhausting at least some of the carbon from the conductive layer so that less than about 10% carbon remains in the conductive layer.

35. The method of claim 25 wherein the exhausting of at least some of the carbon comprises exhausting at least about 50% of the carbon in the conductive layer.

* * * * *